(12) United States Patent
Priewasser et al.

(10) Patent No.: US 11,469,120 B2
(45) Date of Patent: Oct. 11, 2022

(54) DEVICE AND METHOD FOR ATTACHING PROTECTIVE TAPE TO SEMICONDUCTOR WAFER

(71) Applicants: DISCO HI-TEC EUROPE GMBH, Kirchheim b. Muenchen (DE); TAKATORI CORPORATION, Kashihara (JP)

(72) Inventors: Karl Heinz Priewasser, Kirchheim b. Muenchen (DE); Yoshinori Kakinuma, Kashihara (JP); Yosuke Ishimatsu, Kashihara (JP); Ken Ikehata, Kashihara (JP)

(73) Assignees: DISCO HI-TEC EUROPE GMBH, Kirchheim b. Muenchen (DE); TAKATORI CORPORATION, Kashihara (JP)

( * ) Notice: Subject to any disclaimer, the term of this patent is extended or adjusted under 35 U.S.C. 154(b) by 47 days.

(21) Appl. No.: 17/049,398

(22) PCT Filed: Apr. 24, 2018

(86) PCT No.: PCT/JP2018/016543
§ 371 (c)(1),
(2) Date: Oct. 21, 2020

(87) PCT Pub. No.: WO2019/207634
PCT Pub. Date: Oct. 31, 2019

(65) Prior Publication Data
US 2021/0249286 A1 Aug. 12, 2021

(51) Int. Cl.
*H01L 21/67* (2006.01)
*B32B 38/18* (2006.01)
(Continued)

(52) U.S. Cl.
CPC ........ *H01L 21/67132* (2013.01); *B32B 38/18* (2013.01); *H01L 21/6836* (2013.01);
(Continued)

(58) Field of Classification Search
CPC ................ B32B 2457/14; B32B 38/18; H01L 21/67132; H01L 21/6836; H01L 21/304; H01L 21/68742
See application file for complete search history.

(56) References Cited

U.S. PATENT DOCUMENTS

2009/0107633 A1* 4/2009 Yamaguchi .......... B65H 37/002
156/716
2014/0113413 A1* 4/2014 Yamamoto .......... H01L 21/6836
438/118

FOREIGN PATENT DOCUMENTS

JP 2005-159044 A 6/2005
JP 2006-339607 A 12/2006
(Continued)

OTHER PUBLICATIONS

English translation of JP2005-159044.*
(Continued)

*Primary Examiner* — Sonya M Sengupta
(74) *Attorney, Agent, or Firm* — MH2 Technology Law Group, LLP

(57) ABSTRACT

To reduce residual stress generated on a protective tape at a time of application of the protective tape to a semiconductor wafer, provided is an application apparatus (1) for applying a protective tape (PT) to a semiconductor wafer (W), including: a tape conveyance mechanism (2) configured to convey the protective tape (PT) temporarily applied to a base material (BM) to a peeling position; a tape holding body (30) capable of holding the protective tape (PT); a holding-body moving mechanism (31) configured to move the tape holding body (30) to the peeling position; and a peeling mecha-
(Continued)

nism (4) configured to peel the base material (BM) from the protective tape (PT) held by the tape holding body (30) at the peeling position.

5 Claims, 34 Drawing Sheets

(51) Int. Cl.
*H01L 21/683* (2006.01)
*H01L 21/687* (2006.01)
*H01L 21/304* (2006.01)

(52) U.S. Cl.
CPC .... *H01L 21/68742* (2013.01); *B32B 2457/14* (2013.01); *H01L 21/304* (2013.01)

(56) References Cited

FOREIGN PATENT DOCUMENTS

| | | | |
|---|---|---|---|
| JP | 2014-086532 | A | 5/2014 |
| JP | 5828532 | B1 | 12/2015 |

OTHER PUBLICATIONS

International Search Report (with English translation) dated Jun. 5, 2018 for corresponding International Application No. PCT/JP2018/016543, 4 pages.

* cited by examiner

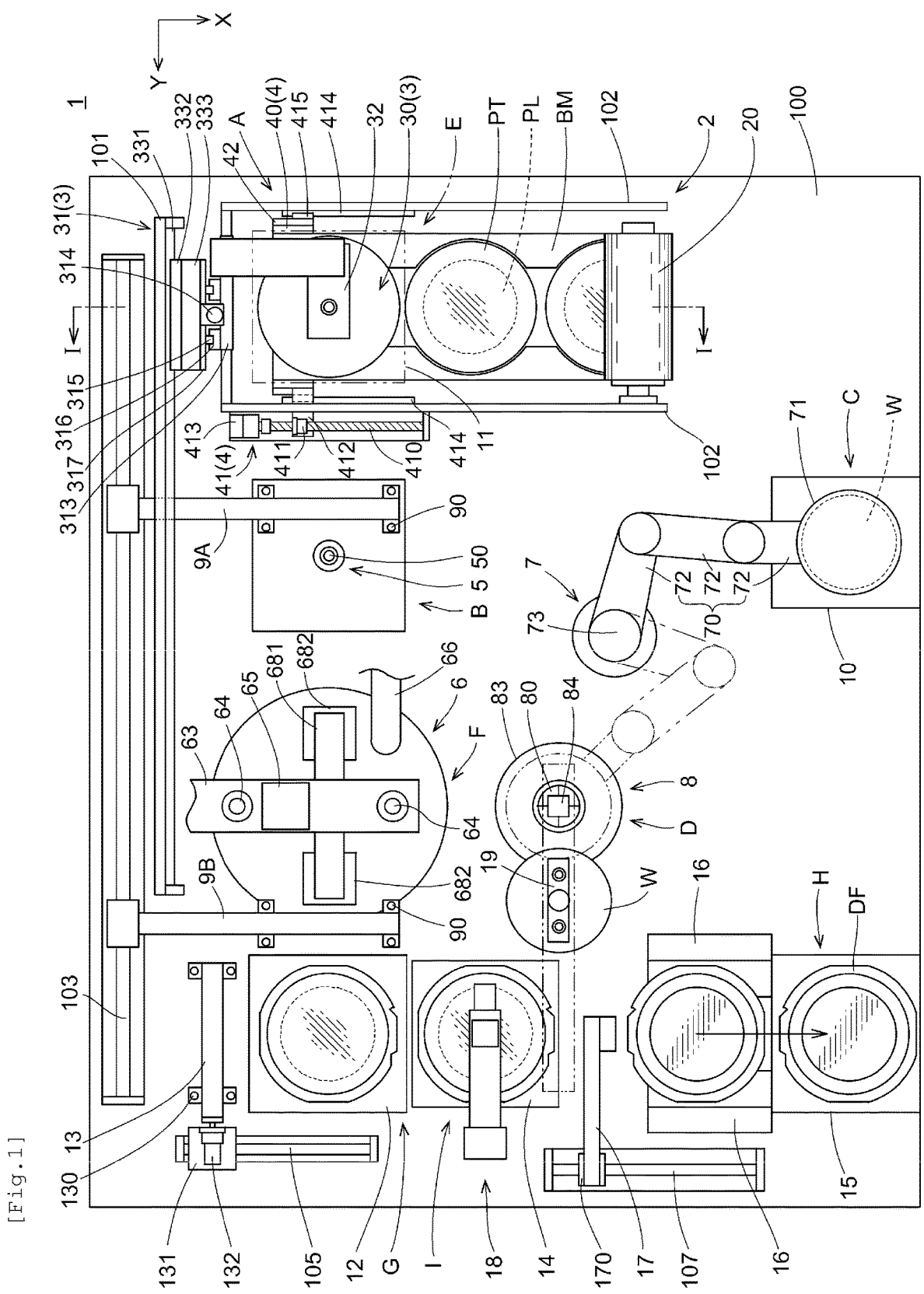
[Fig. 1]

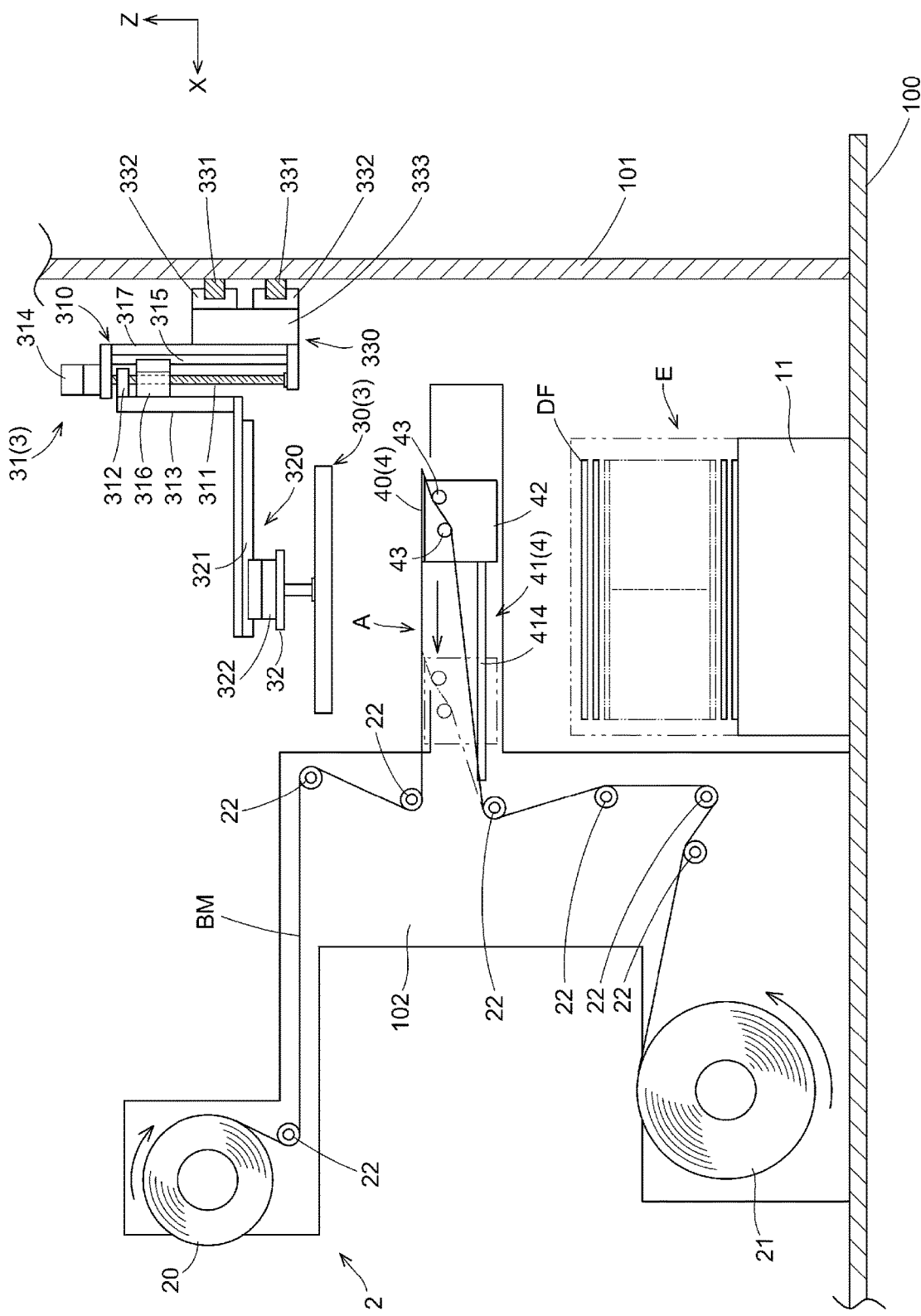
[Fig. 2]

[Fig.3]
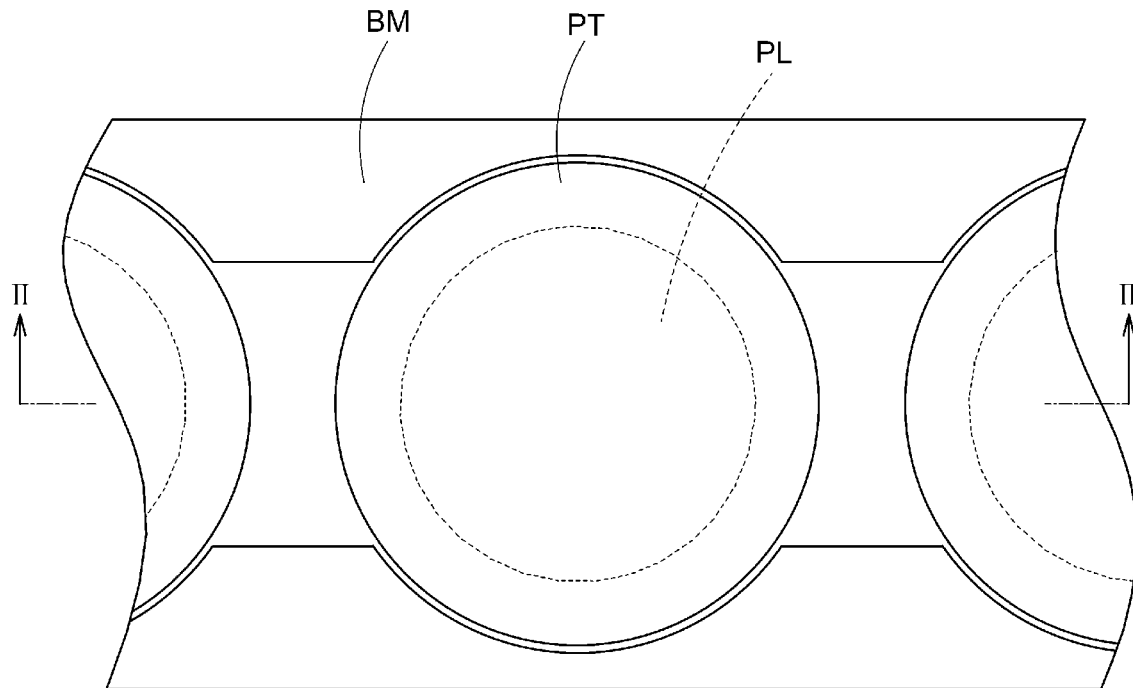
[Fig.4]
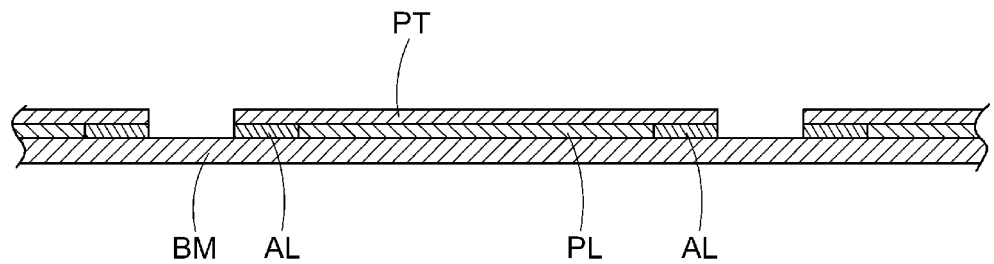

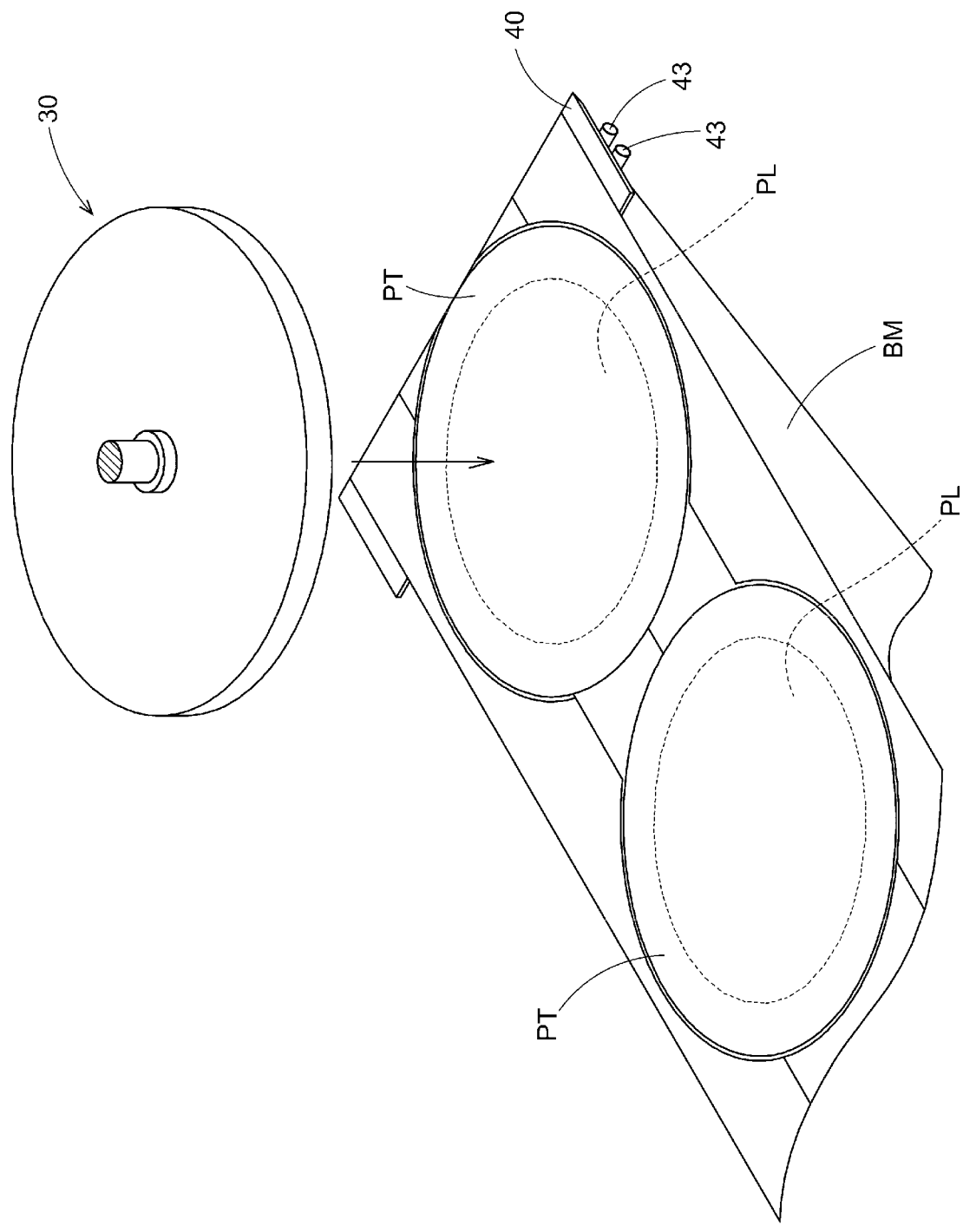
[Fig. 5]

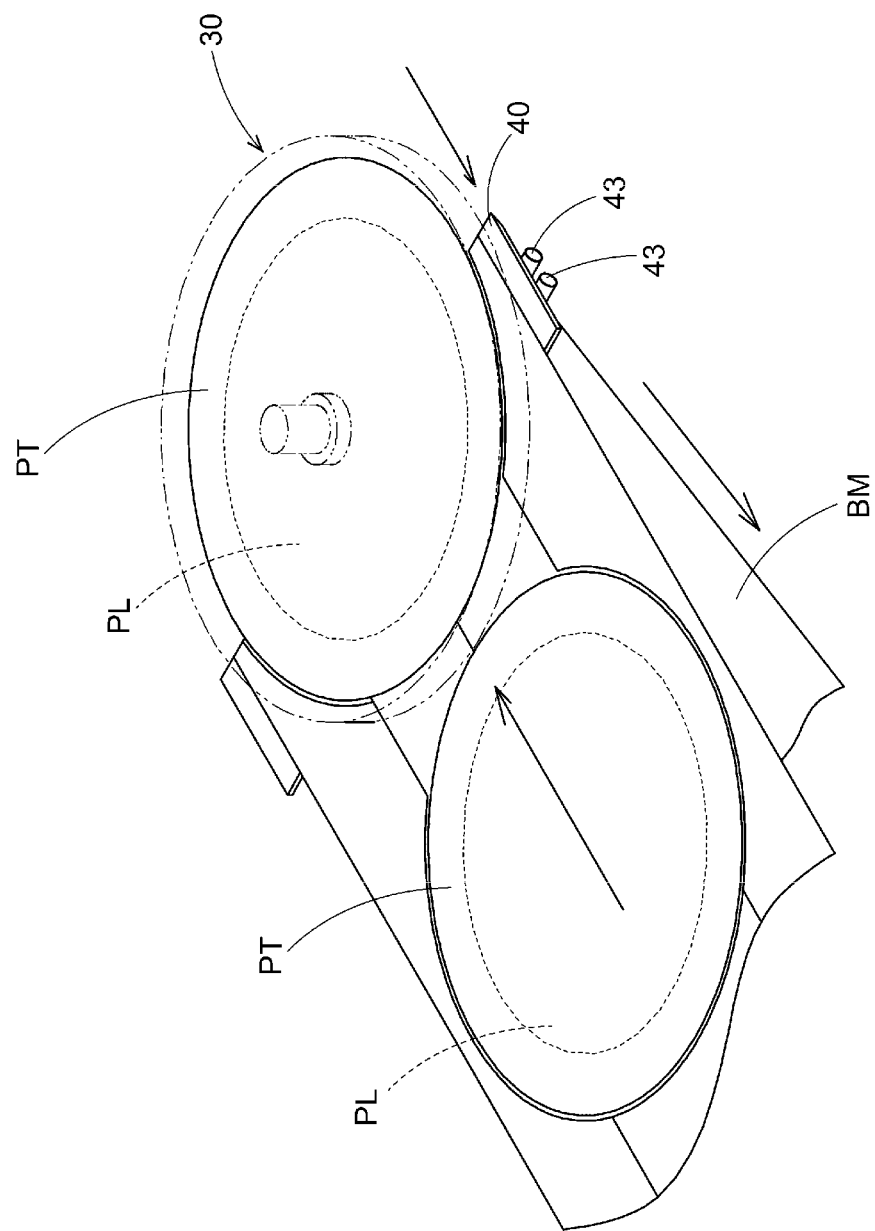
[Fig. 6]

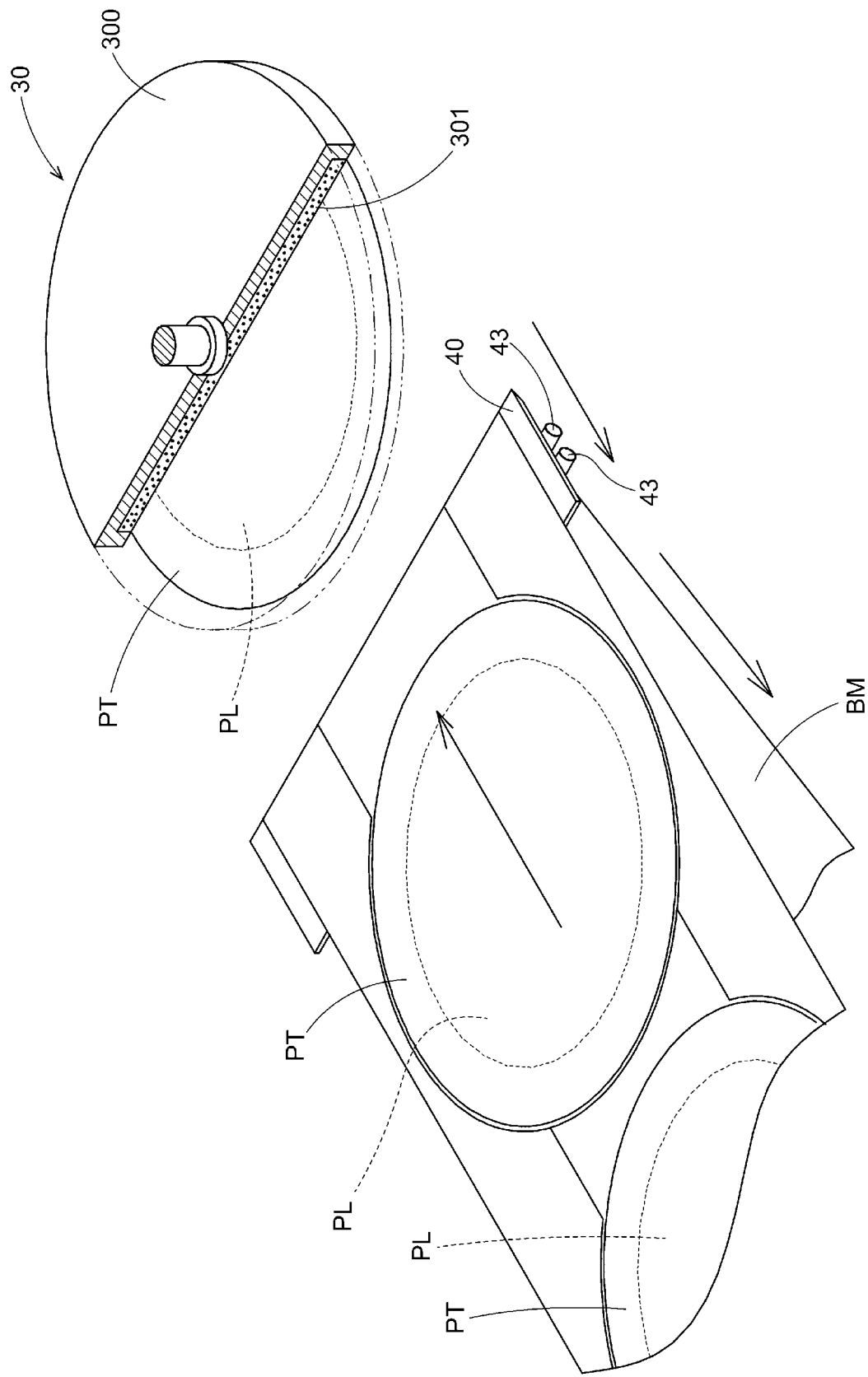
[Fig. 7]

[Fig.8]
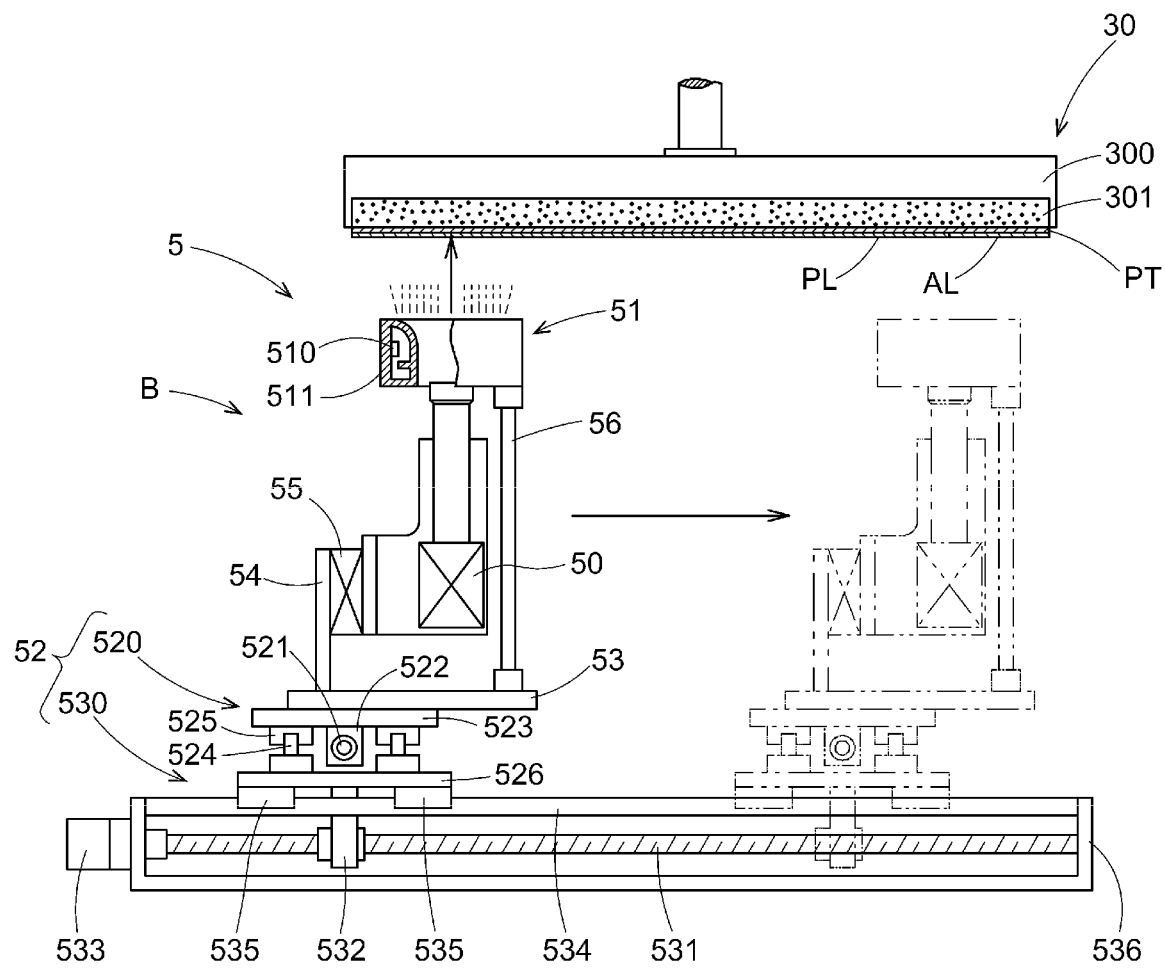

[Fig.9]
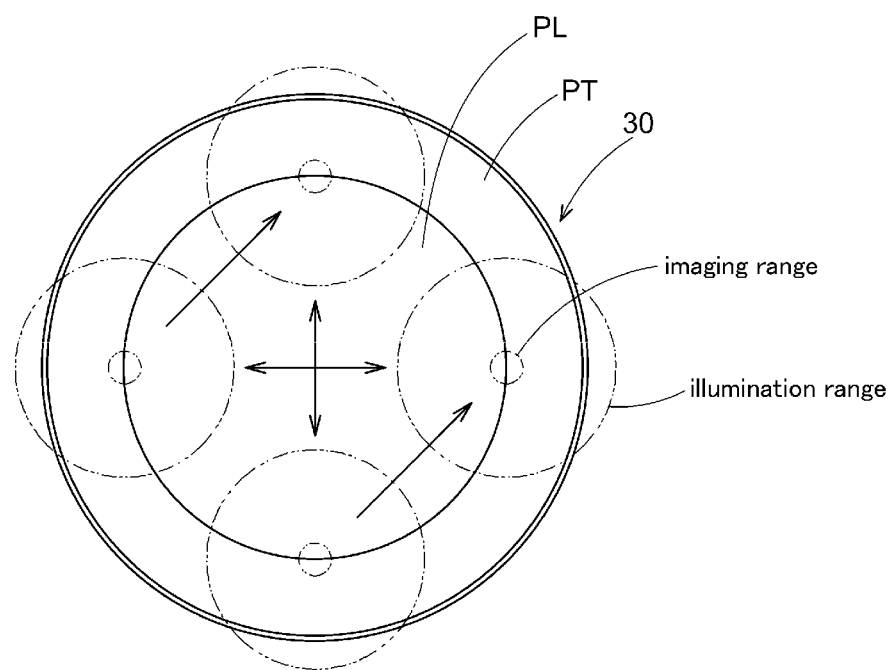

[Fig.10]
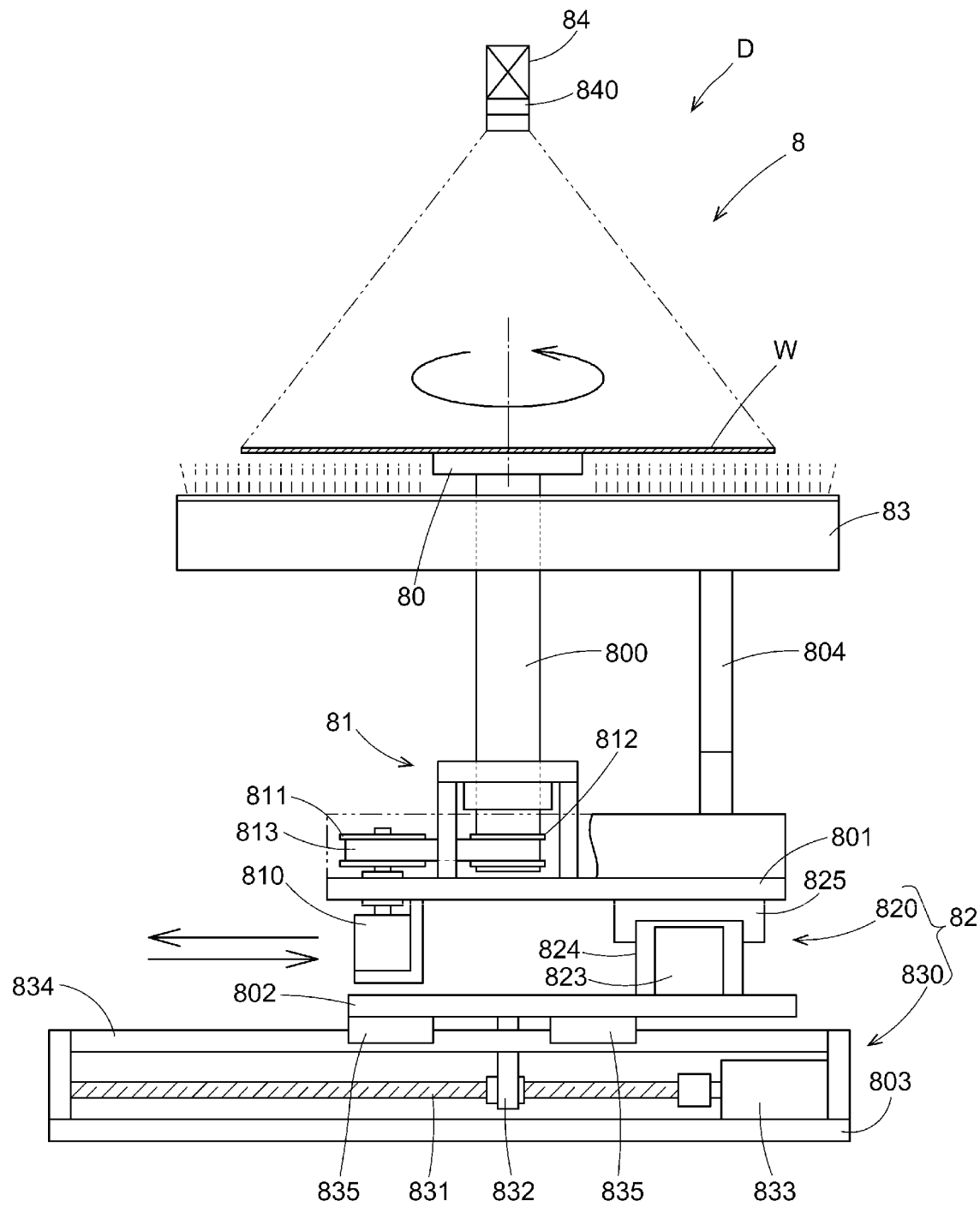

[Fig.11]
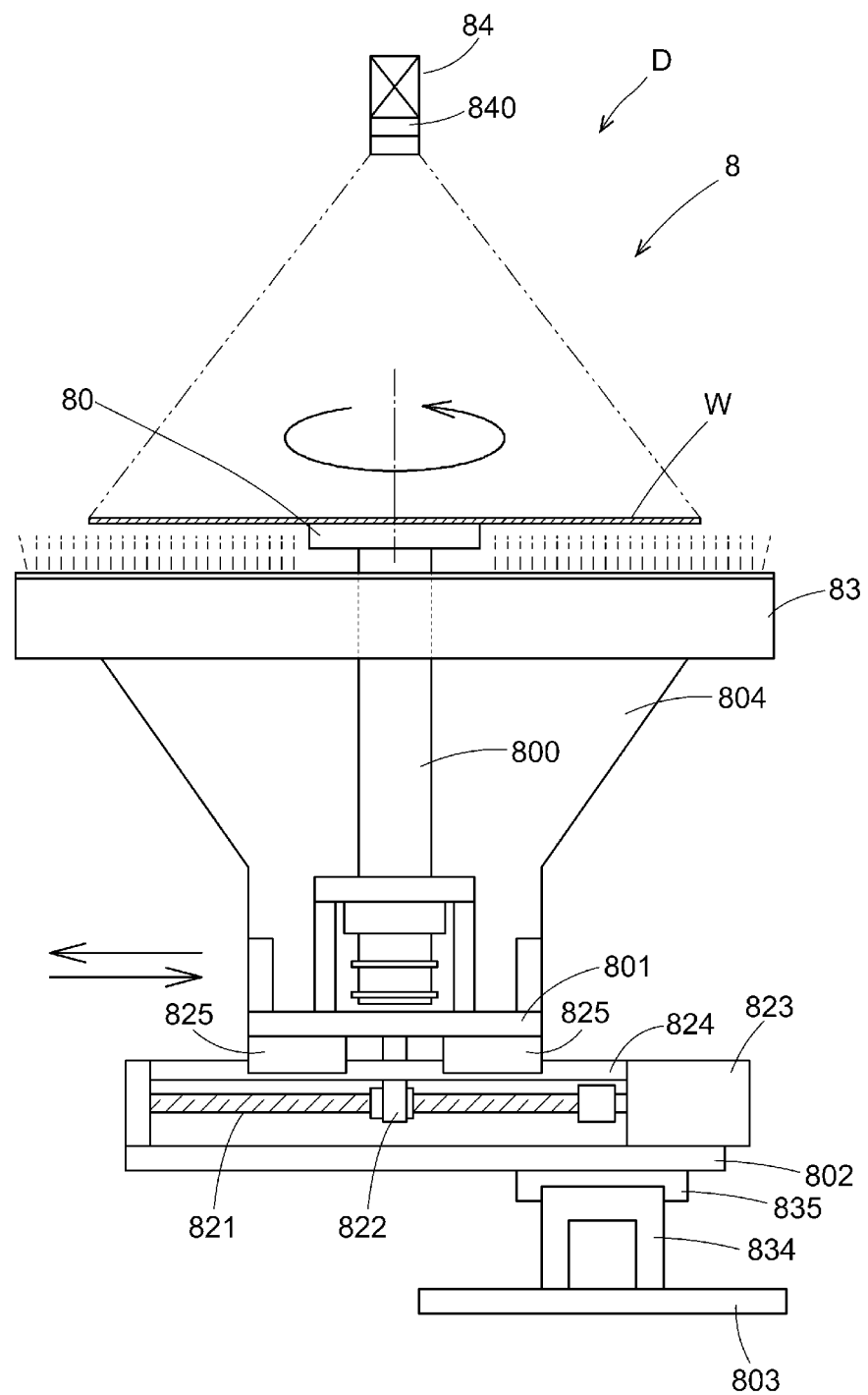

[Fig.12]
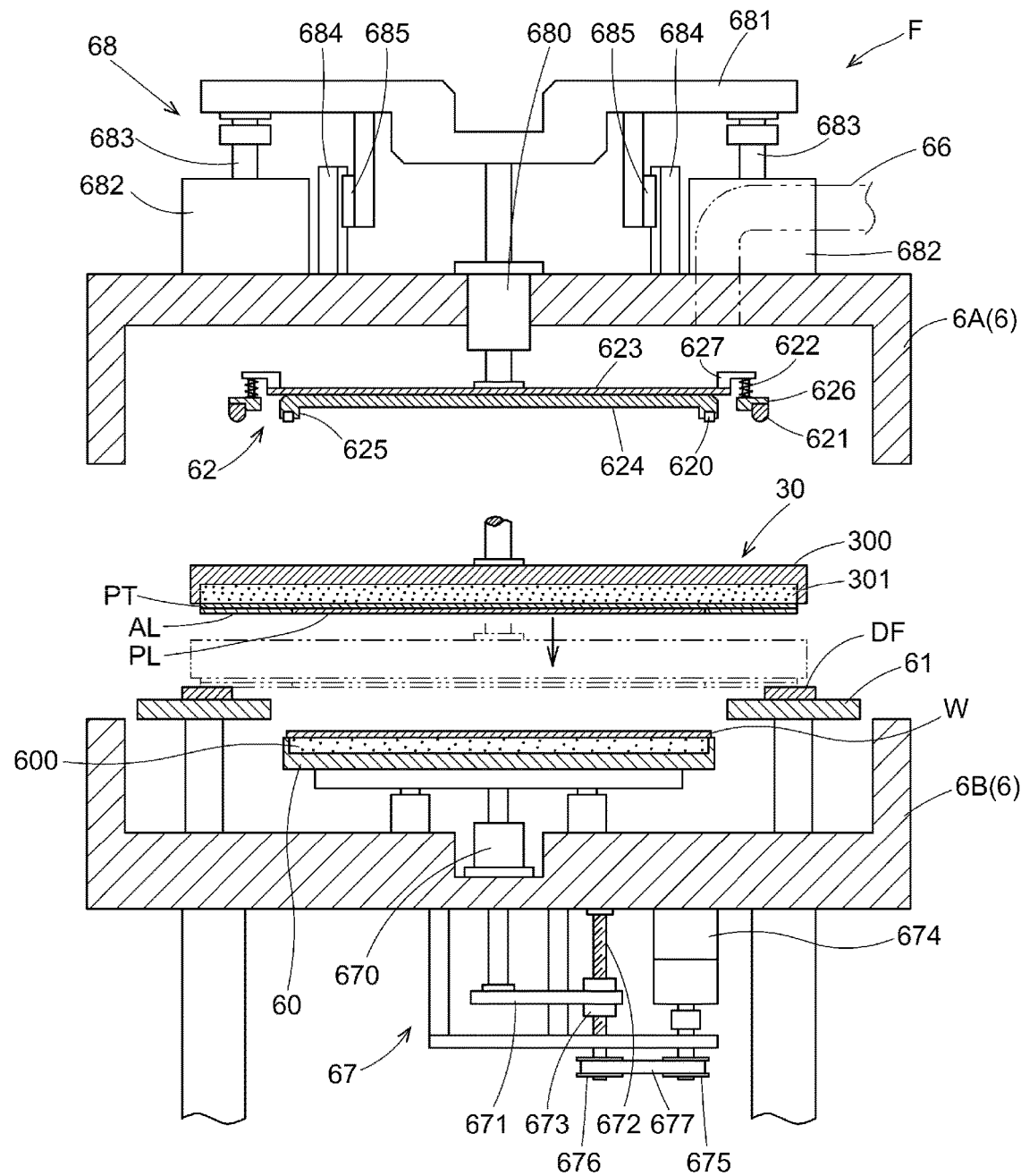

[Fig.13]
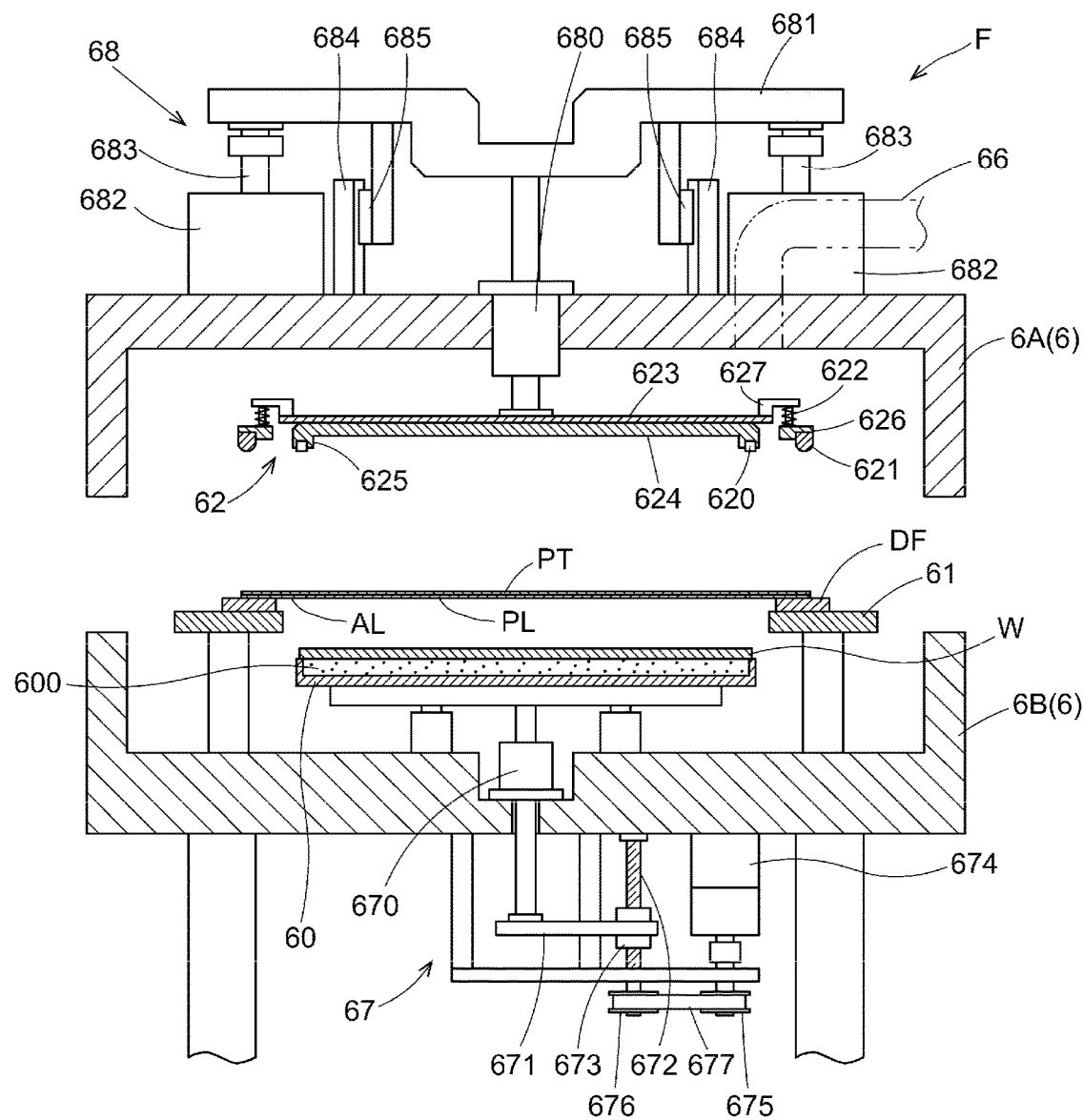

[Fig.14]
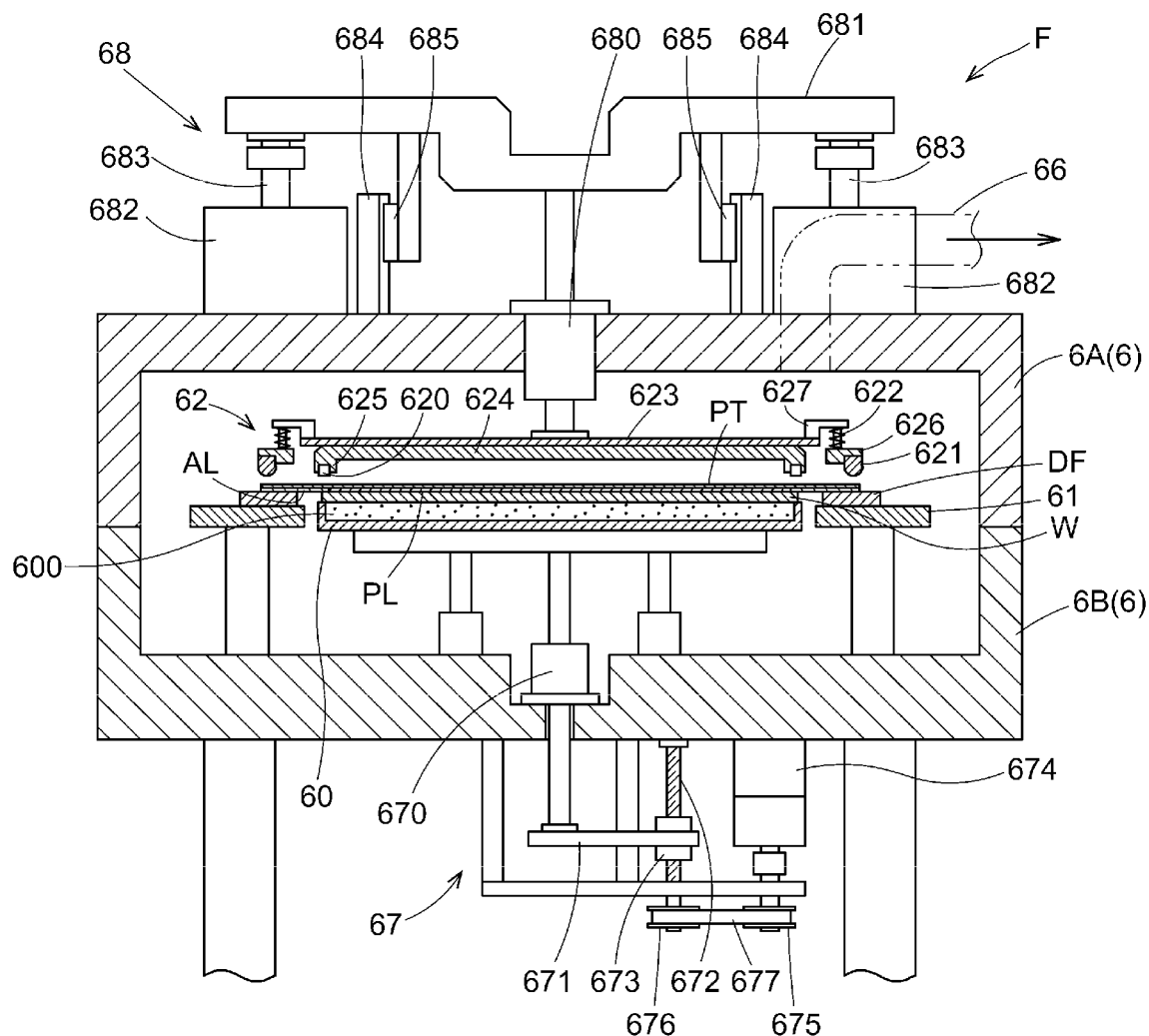

[Fig.15]
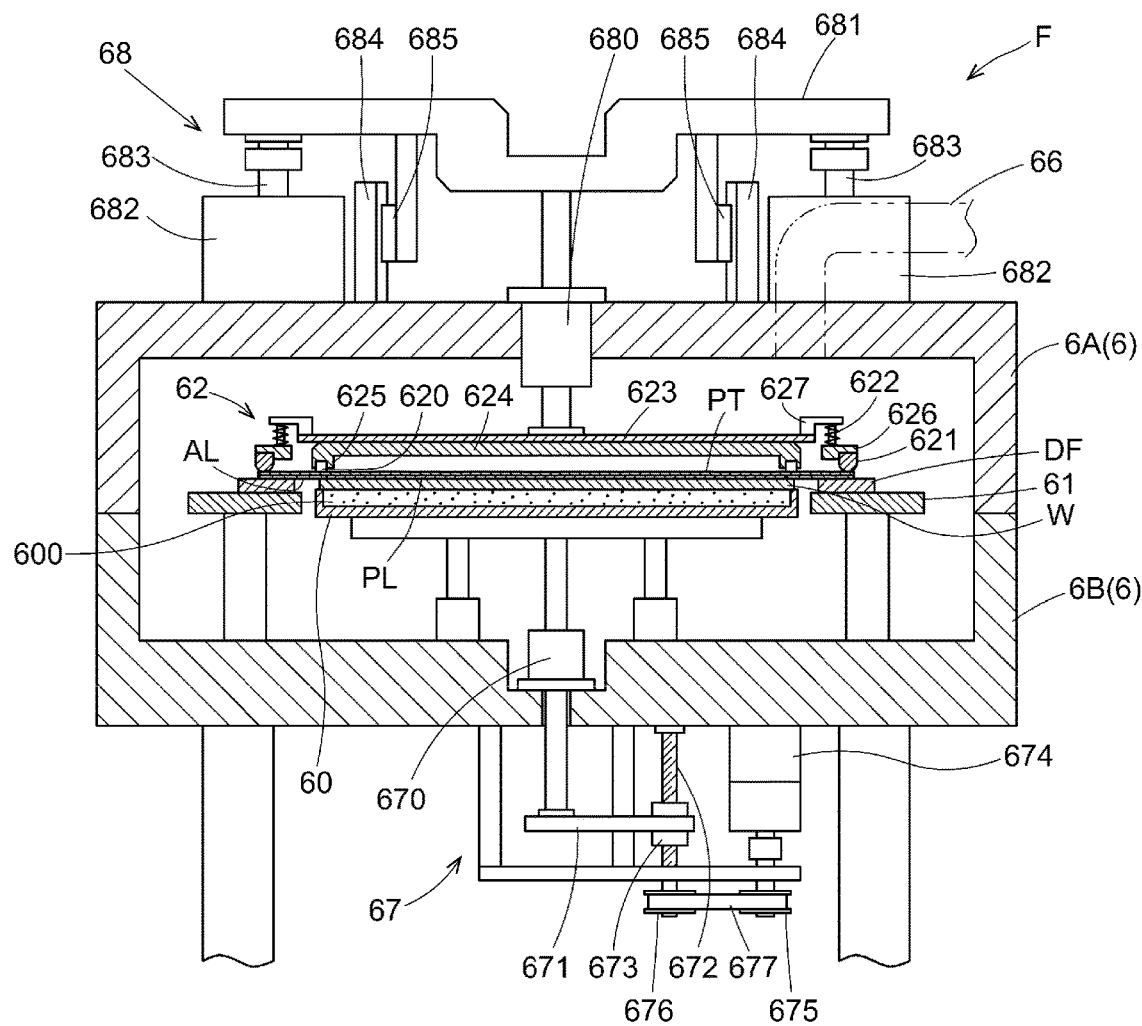

[Fig.16]
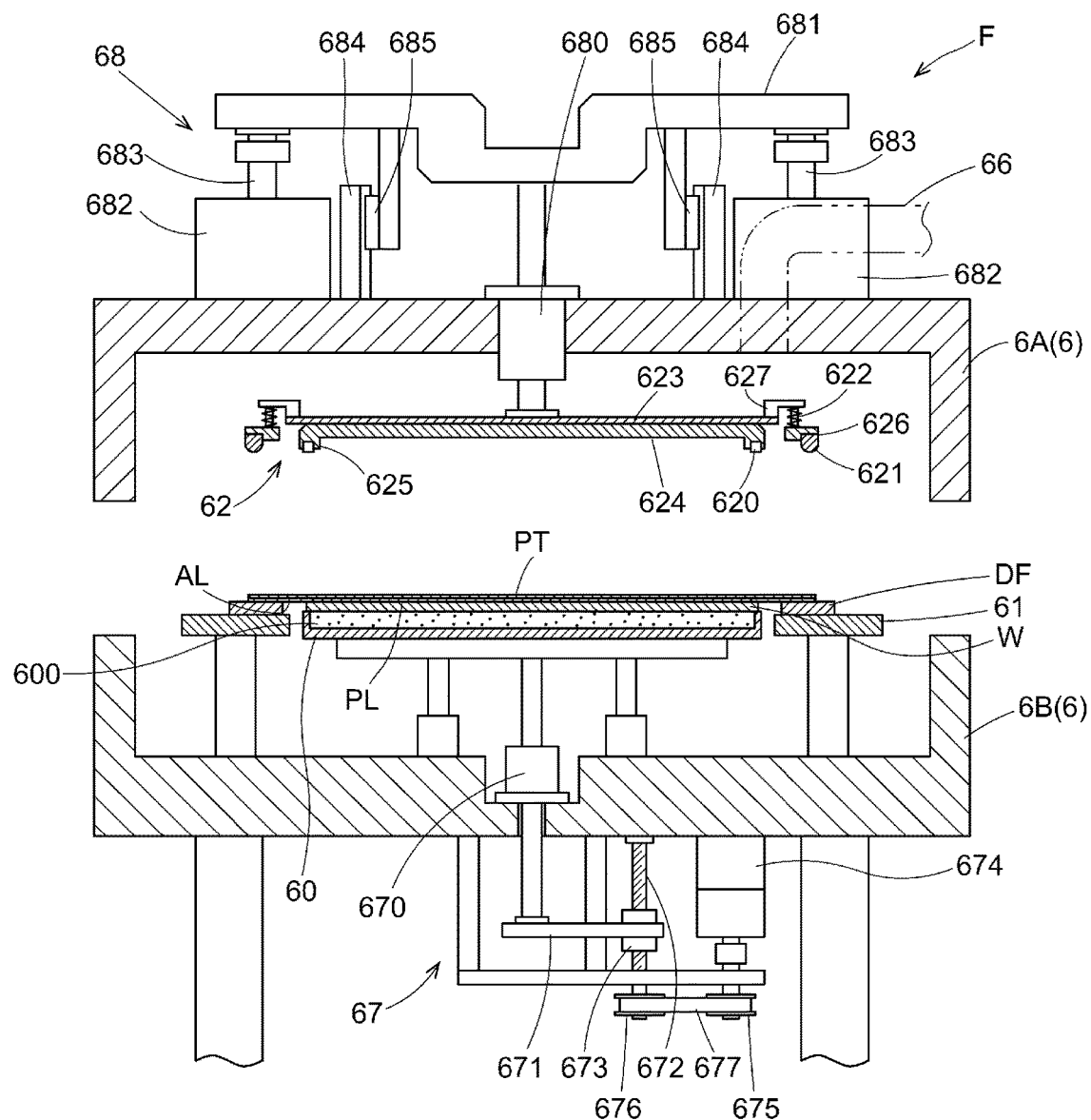

[Fig.17]
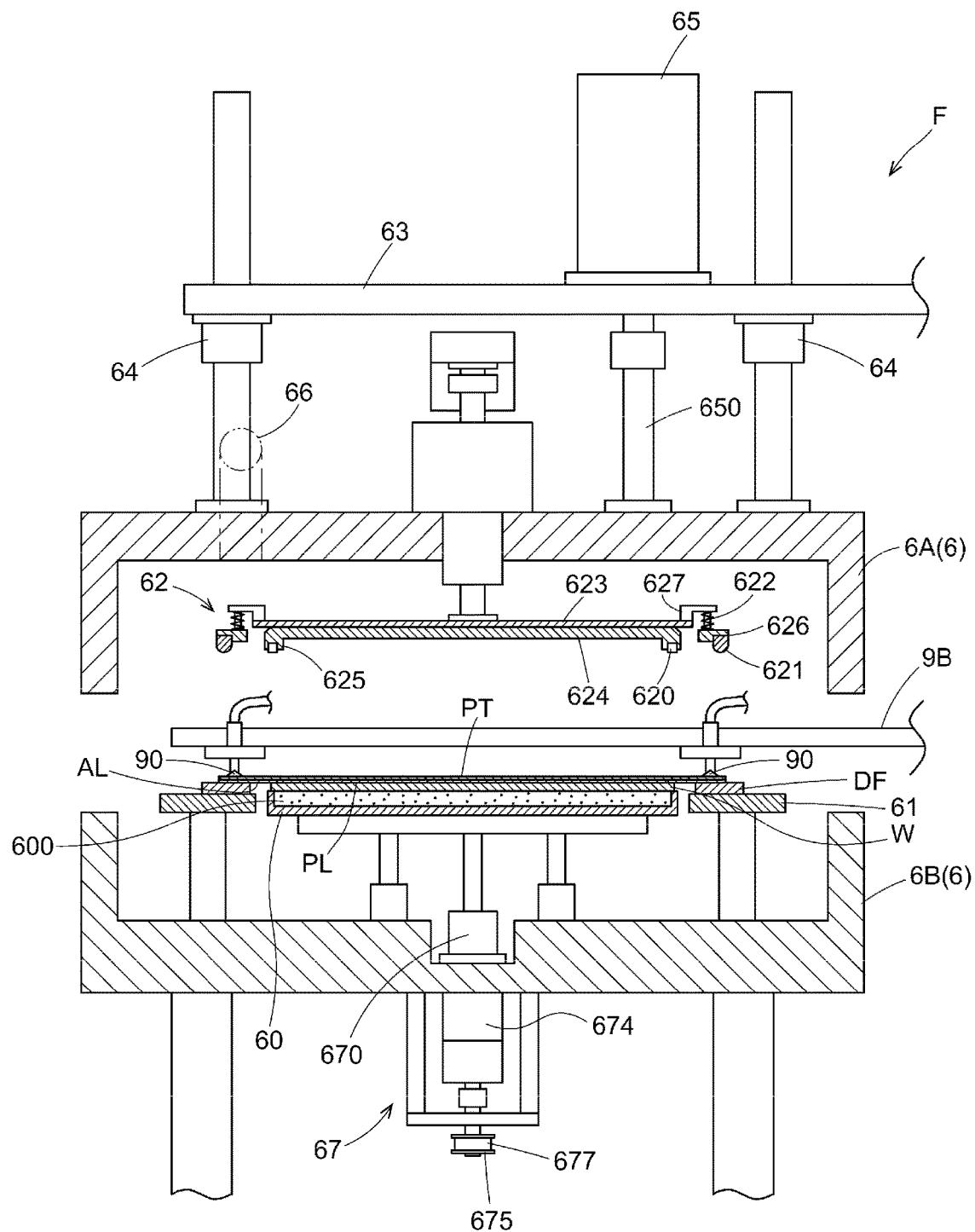

[Fig.18]
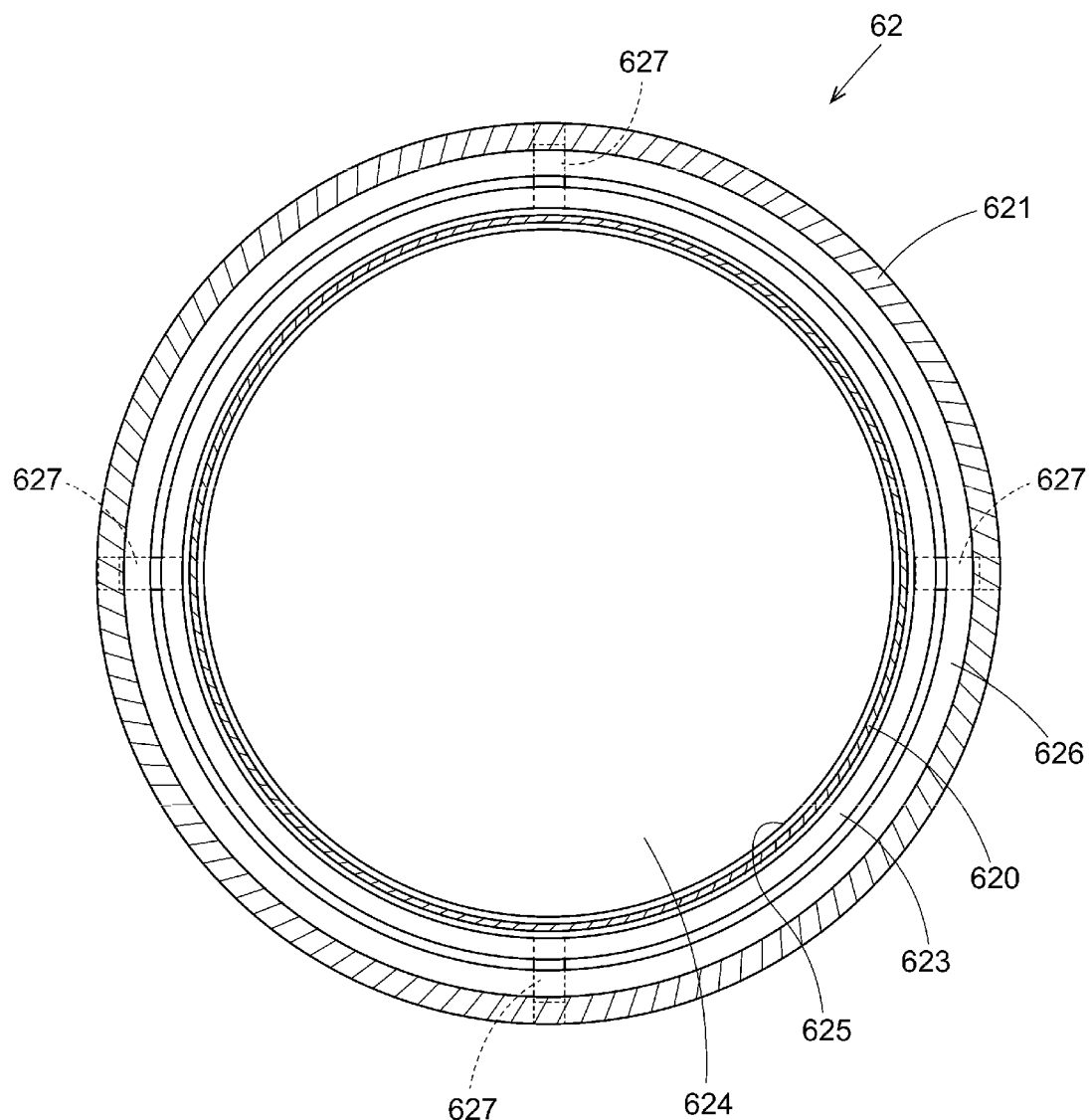

[Fig.19]
(a)
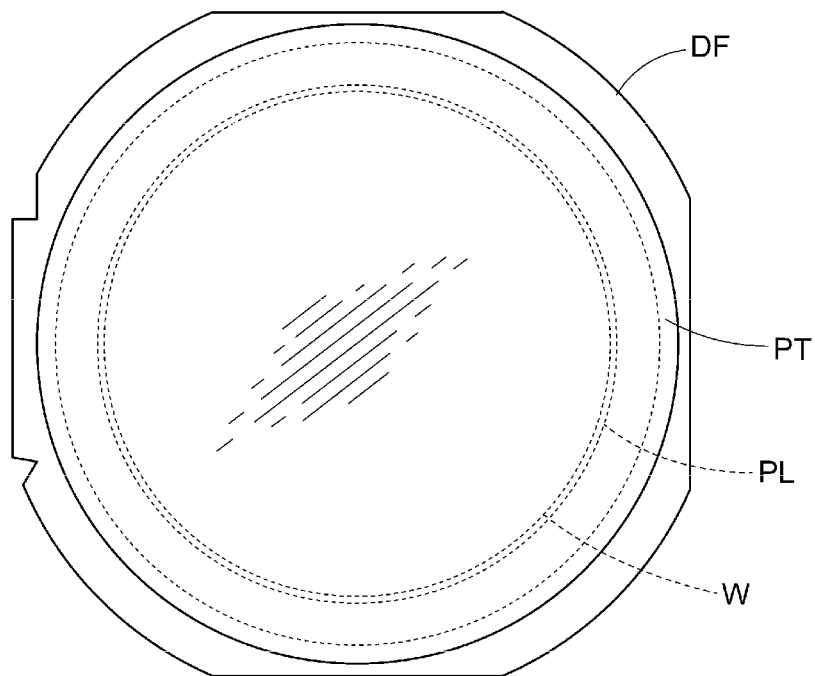
(b)
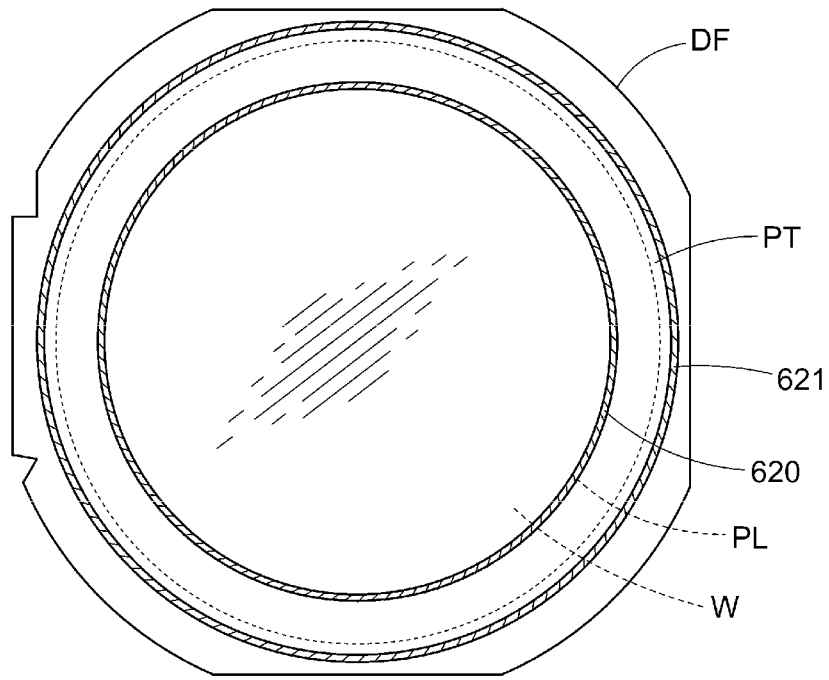

[Fig.20]
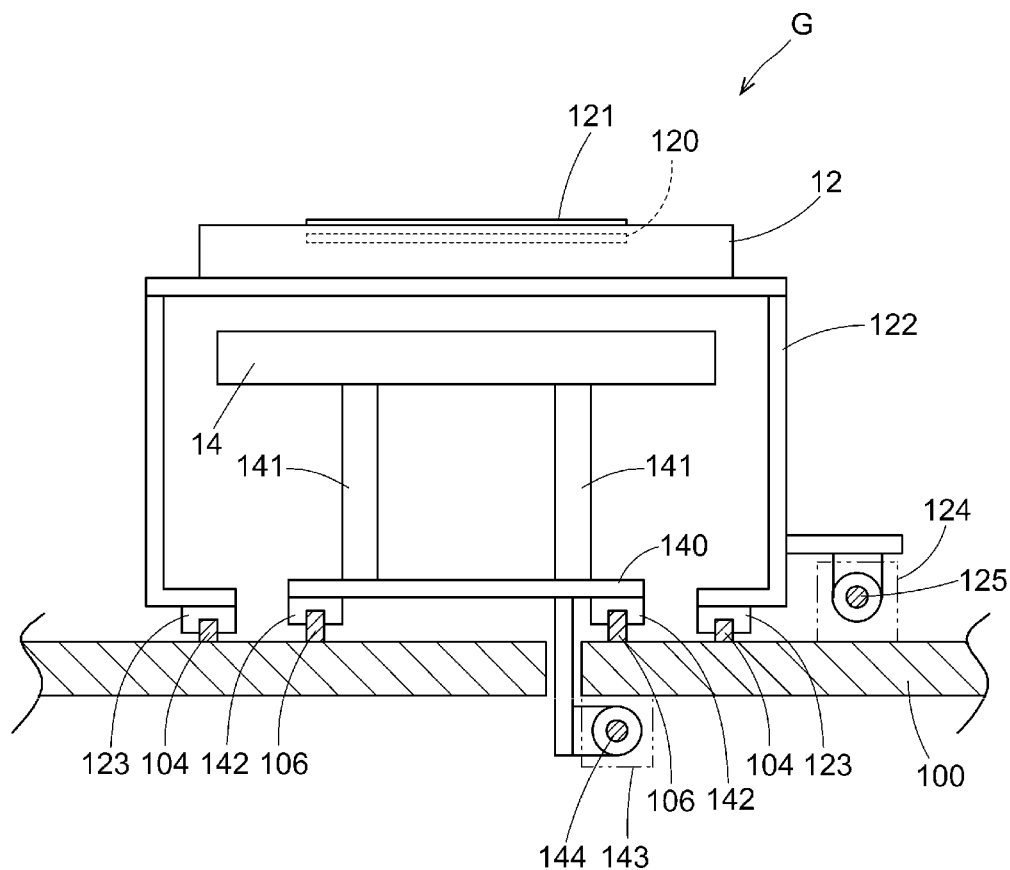

[Fig.21]
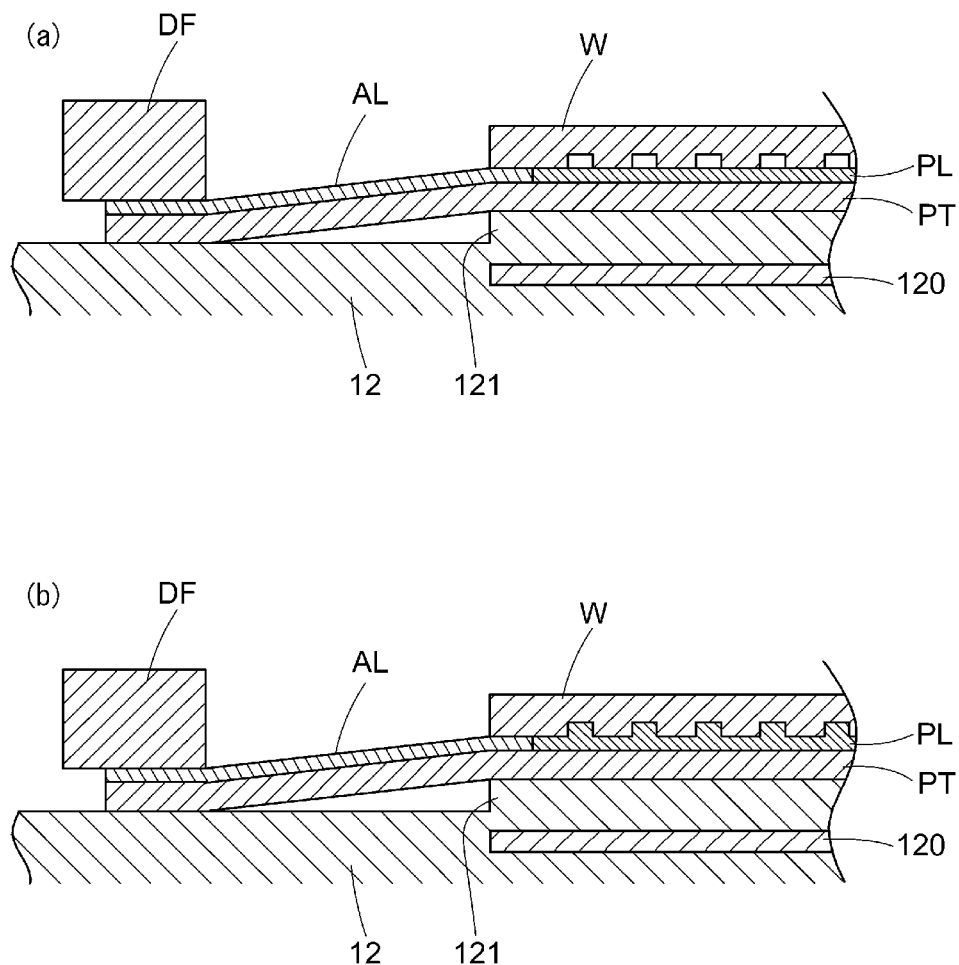

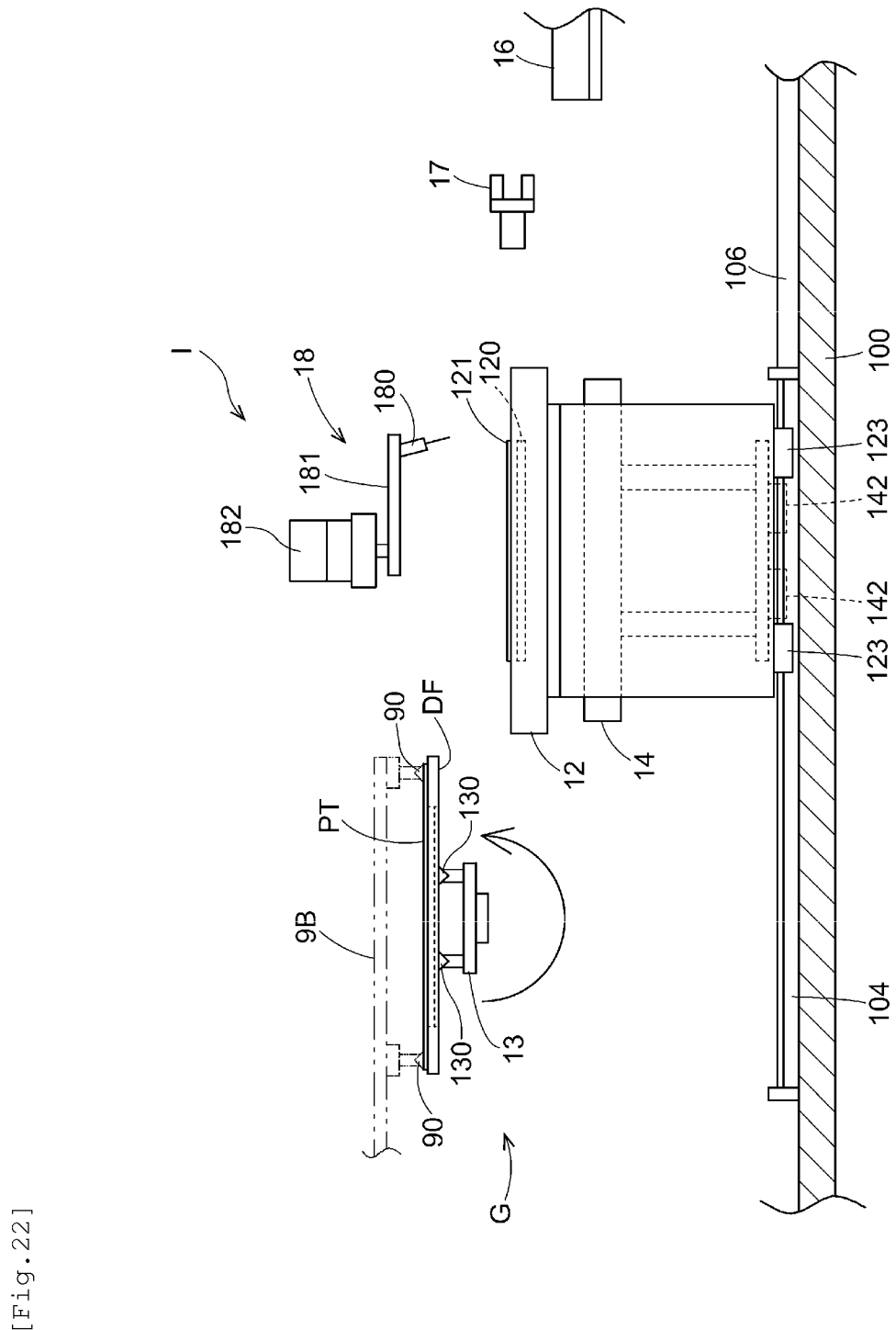
[Fig. 22]

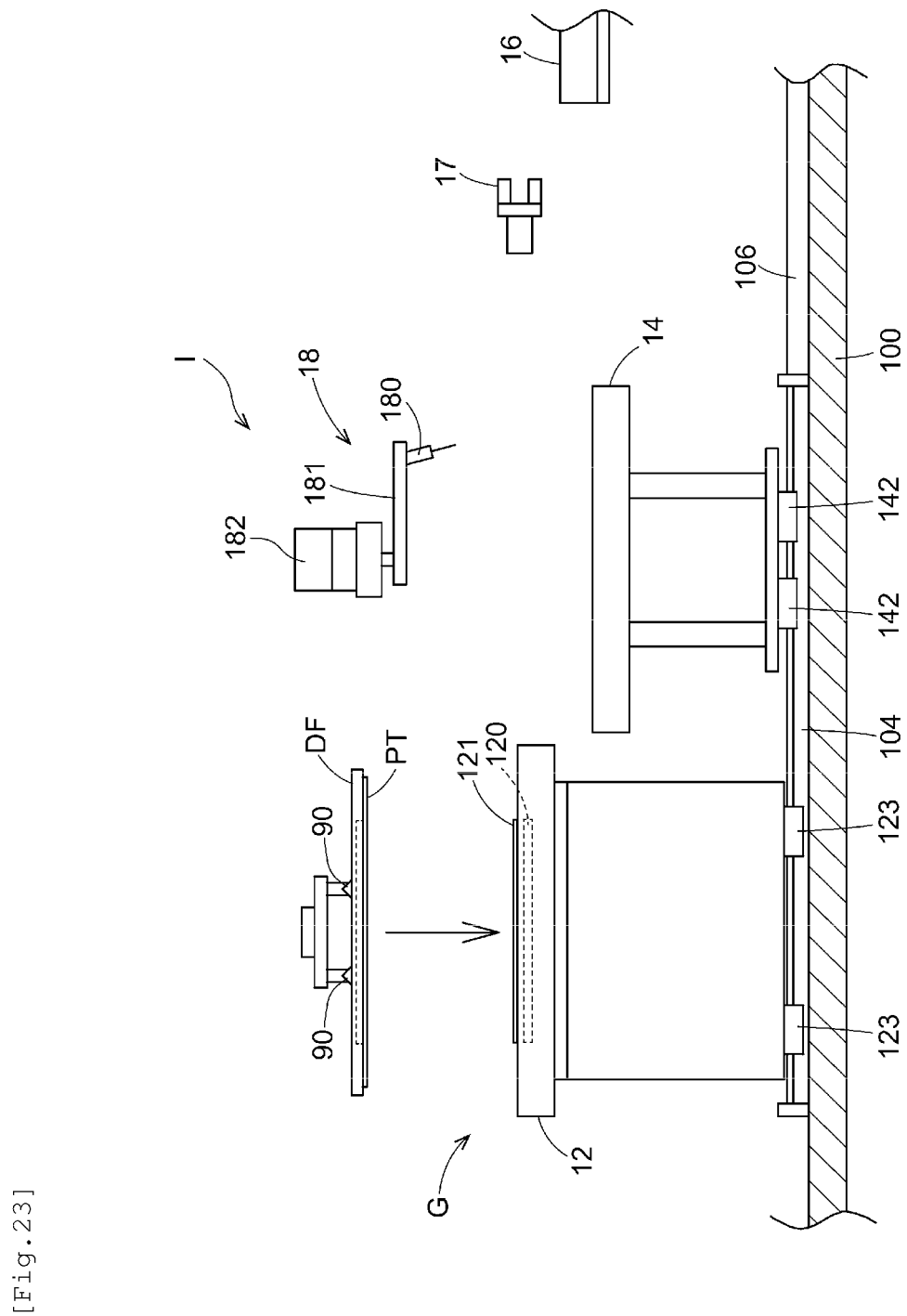

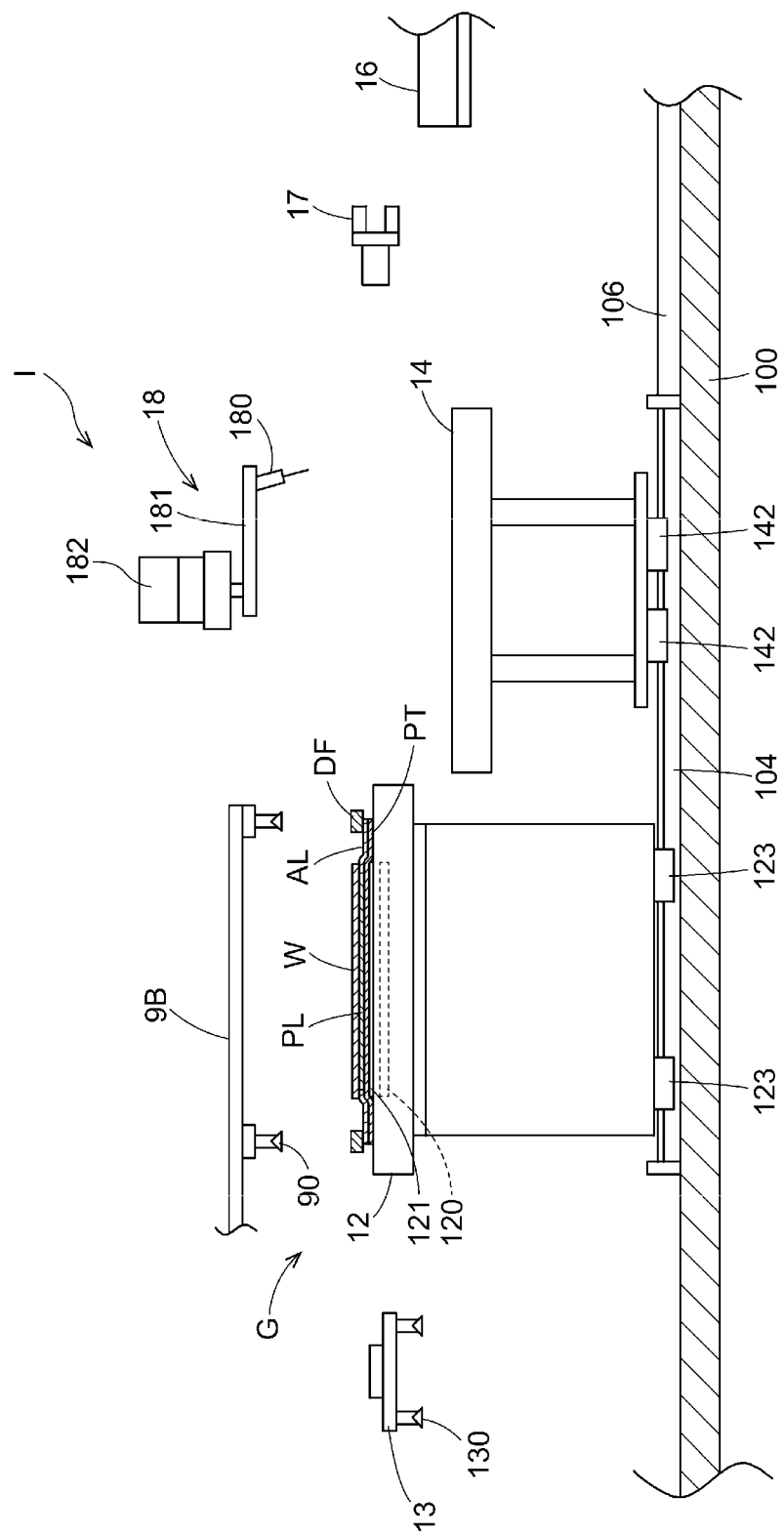

[Fig. 25]
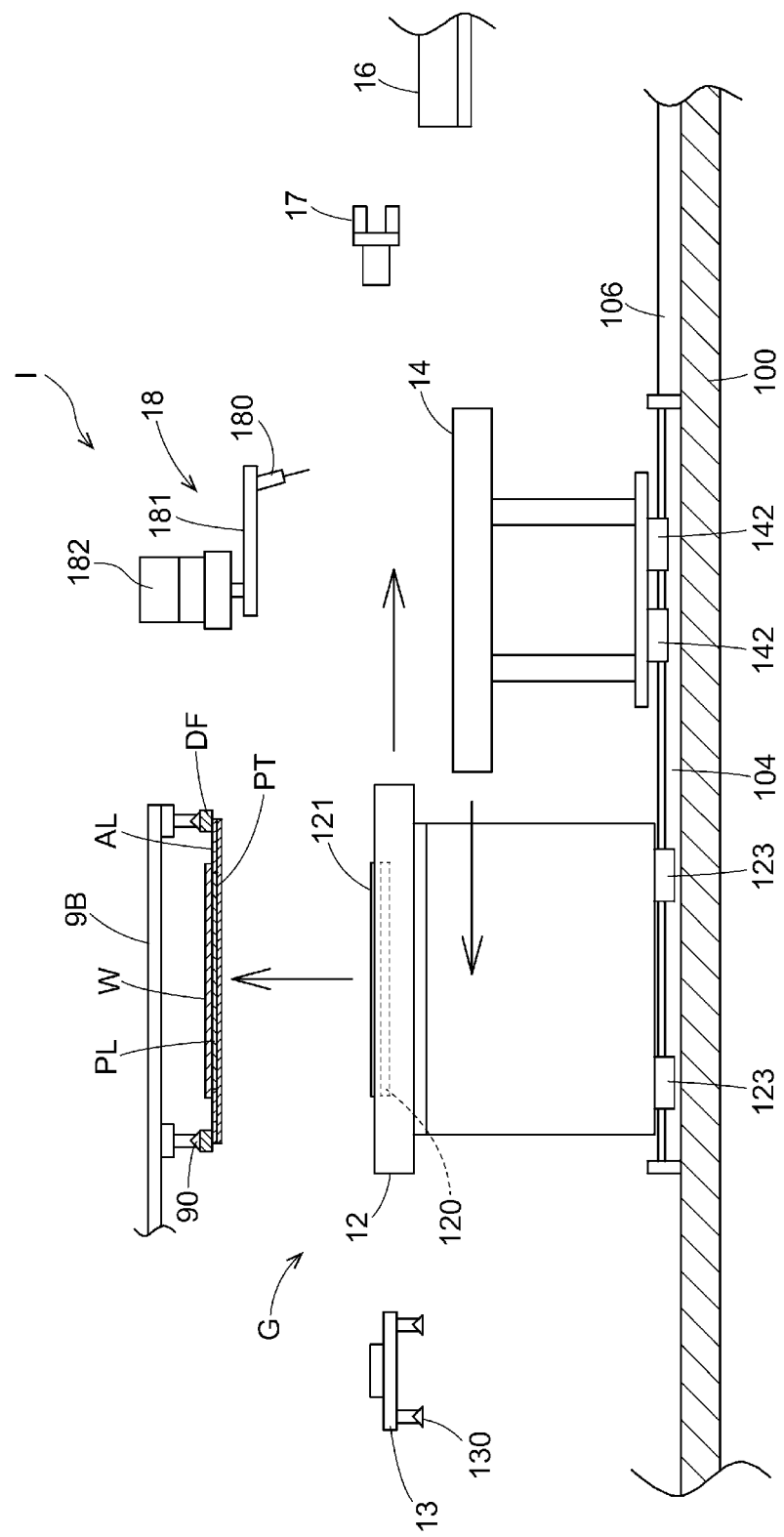

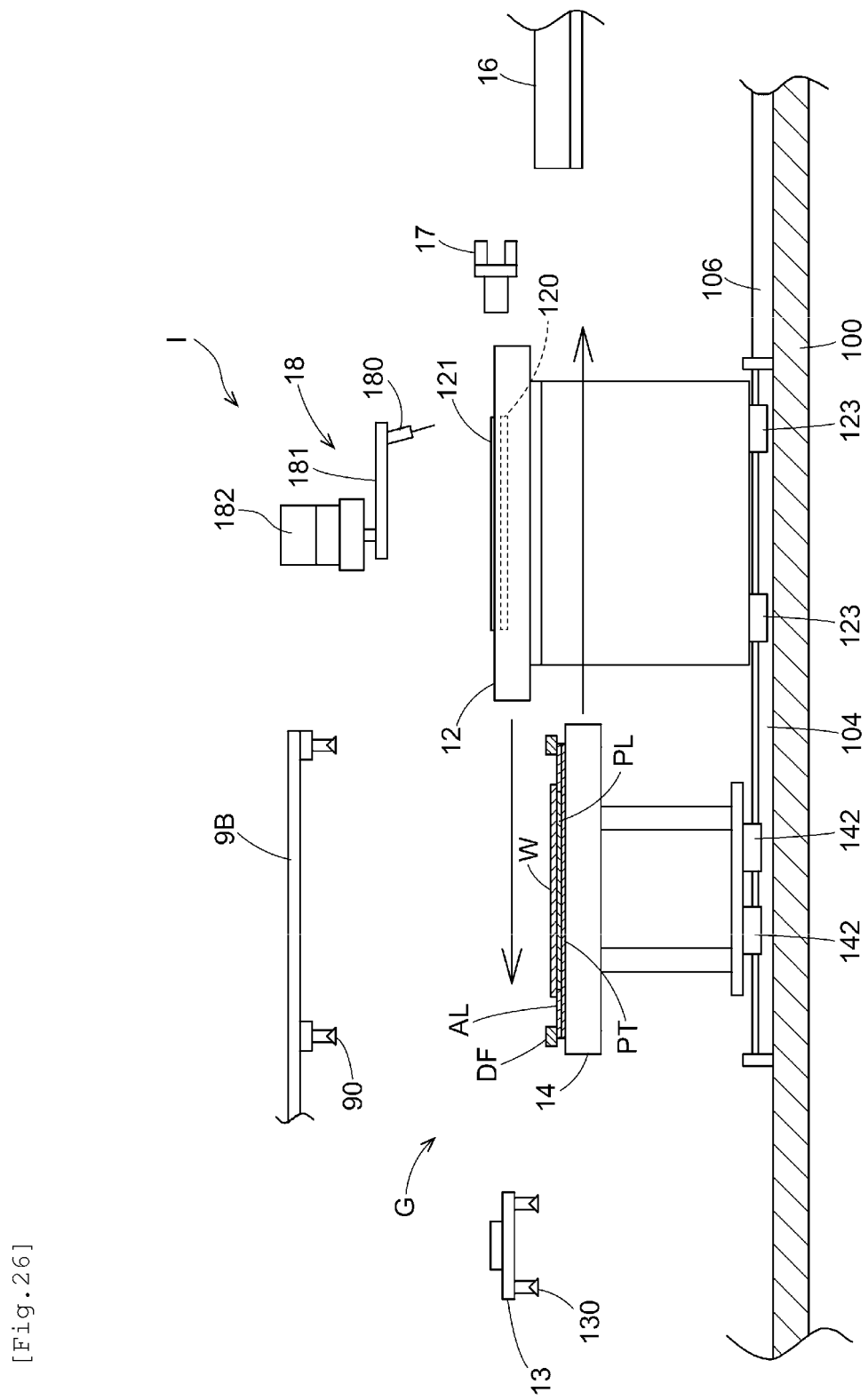

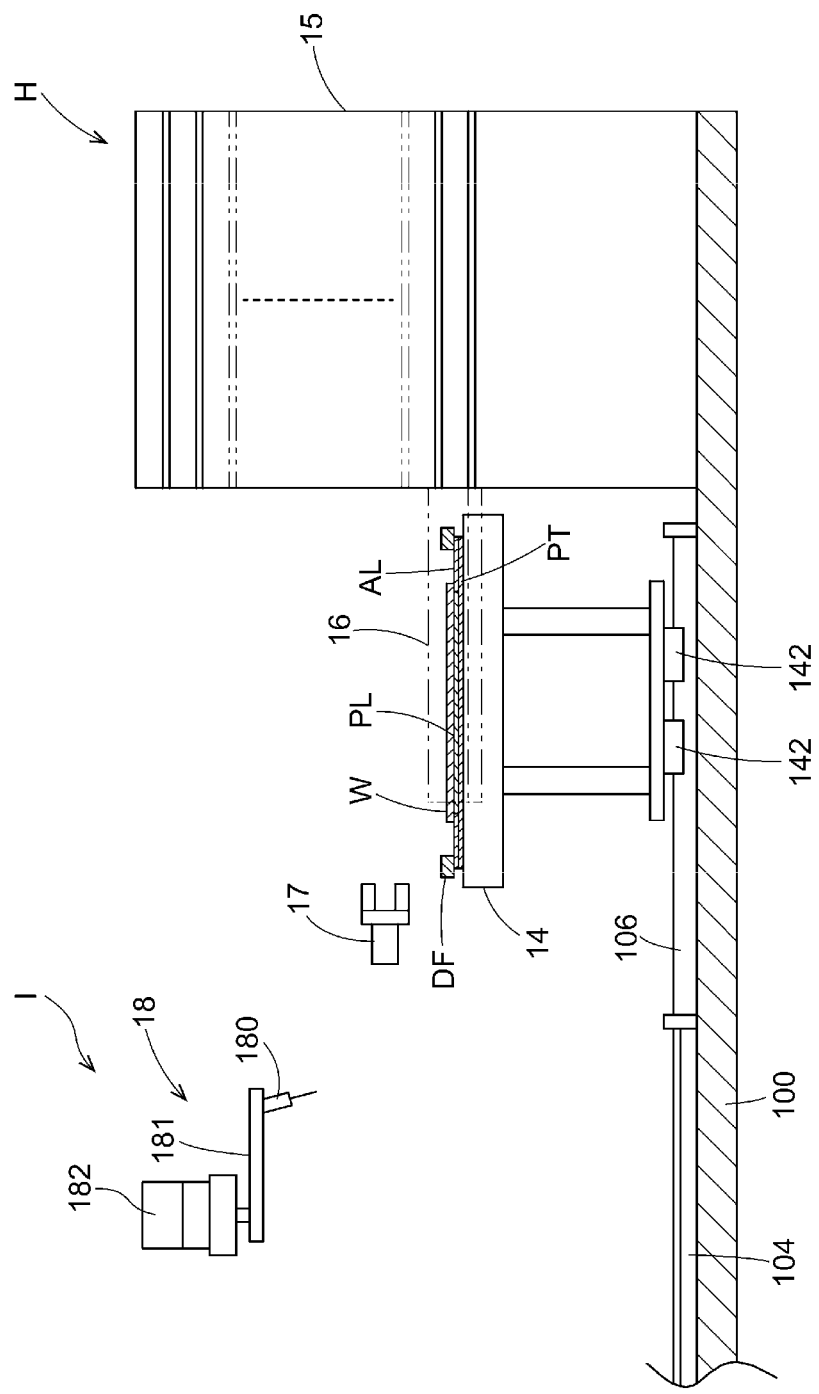
[Fig. 27]

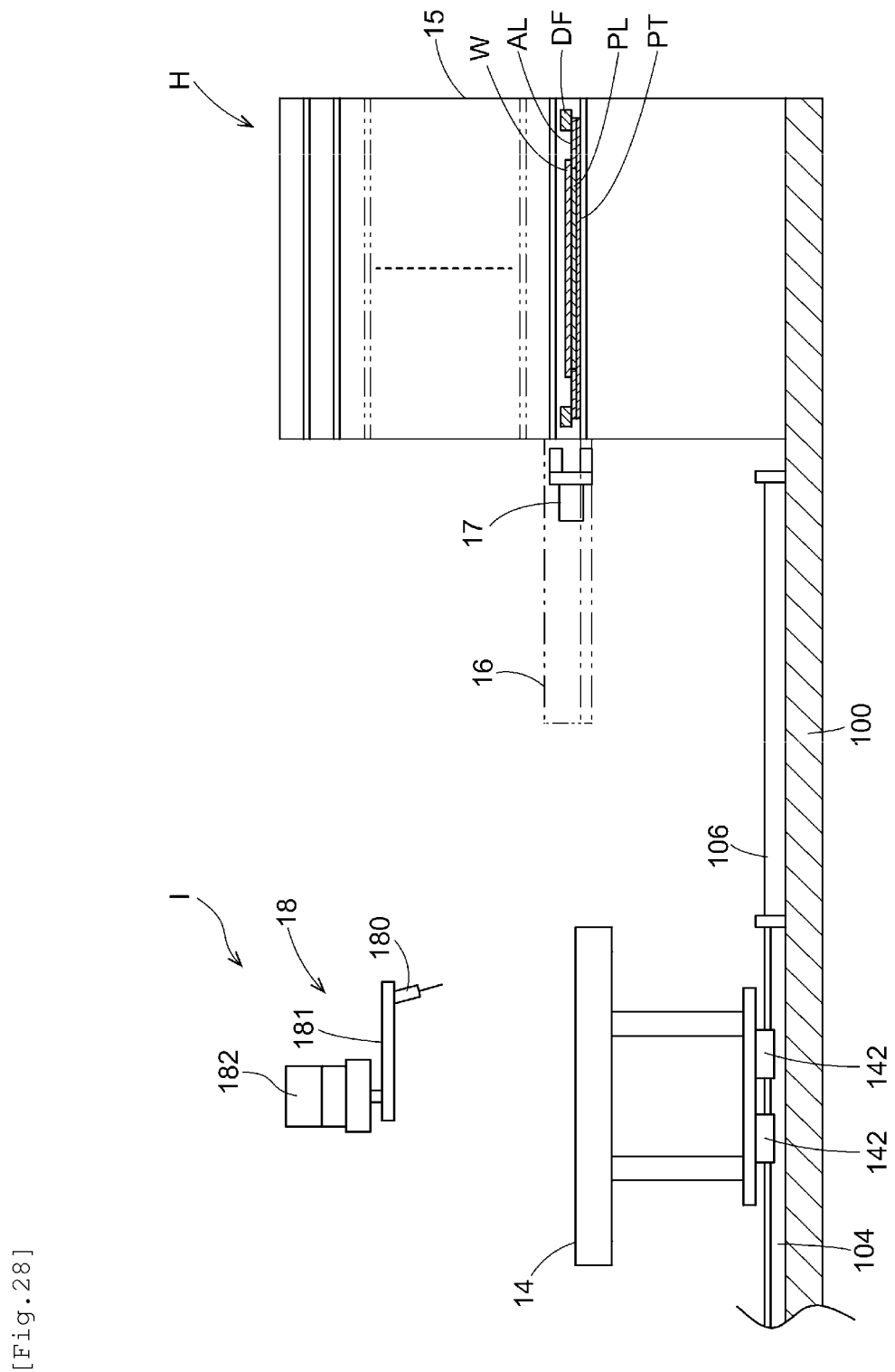

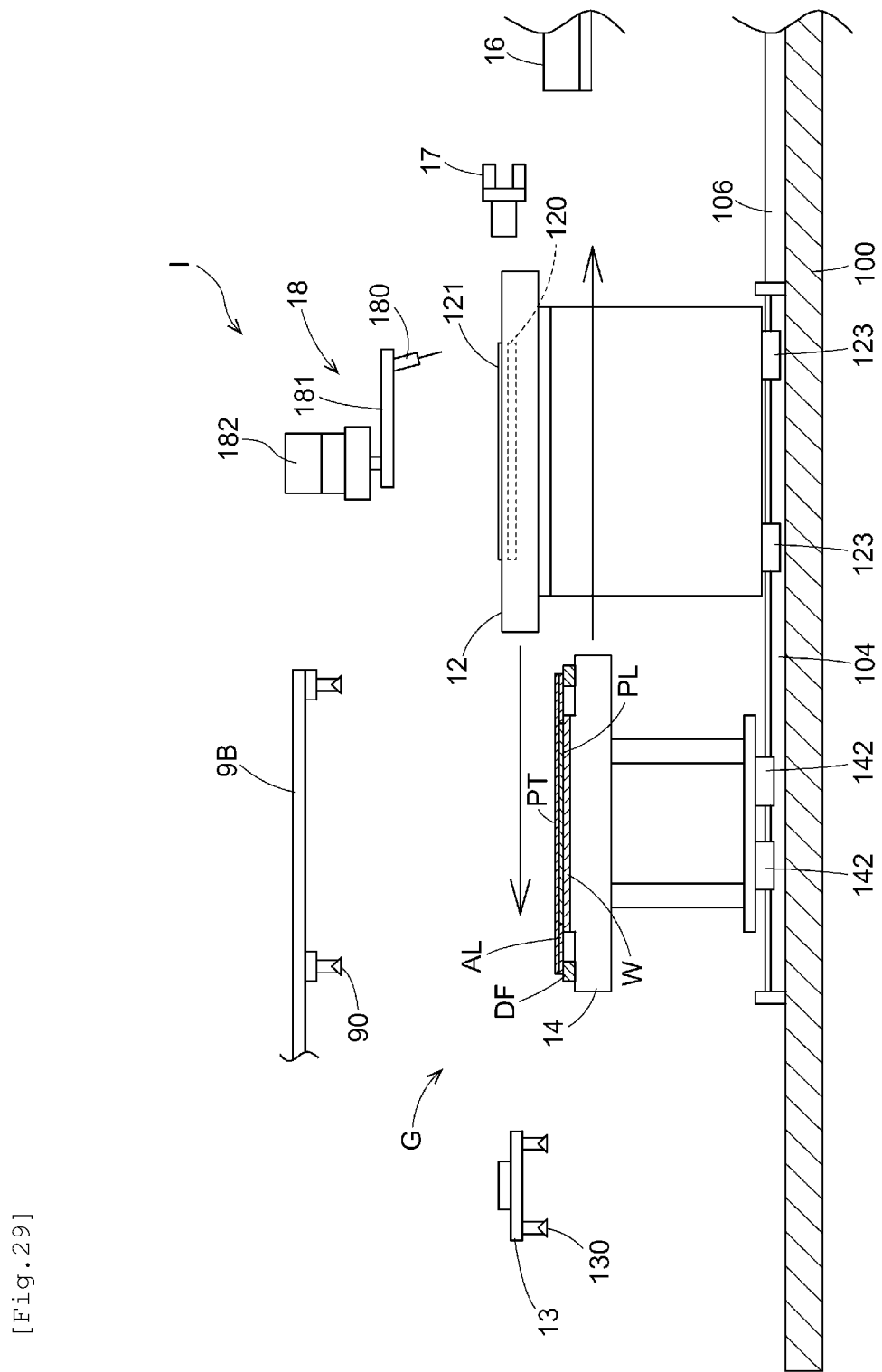
[Fig. 29]

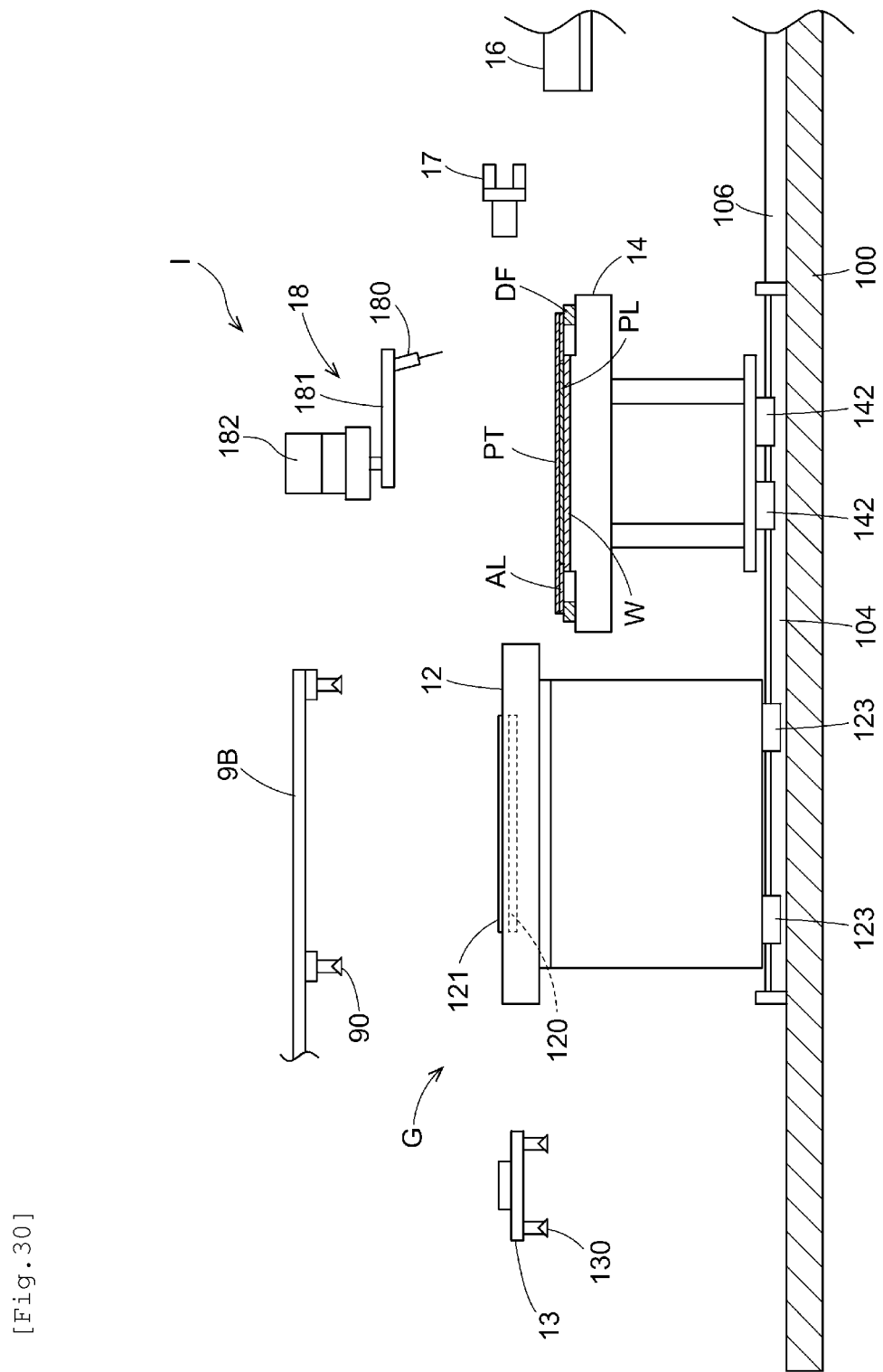
[Fig. 30]

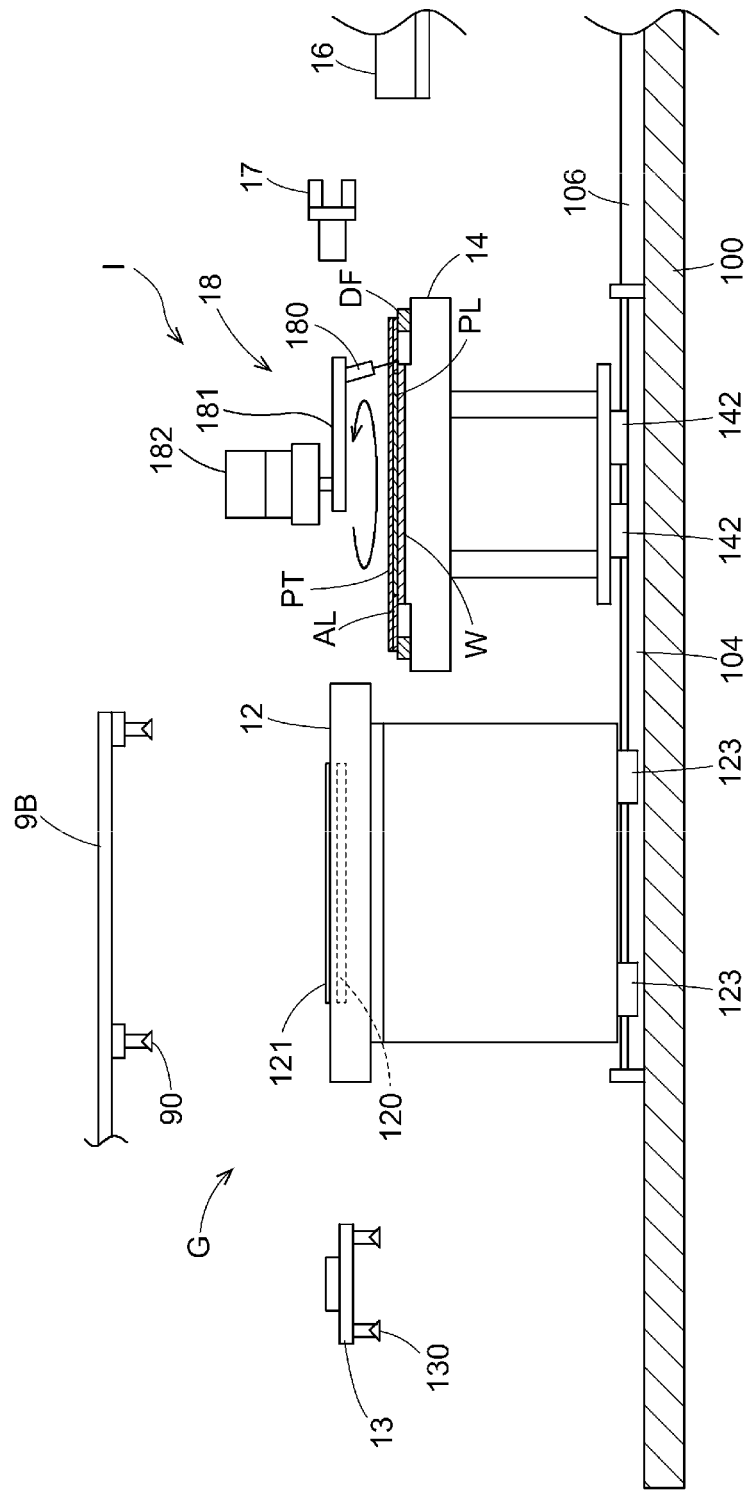
[Fig. 31]

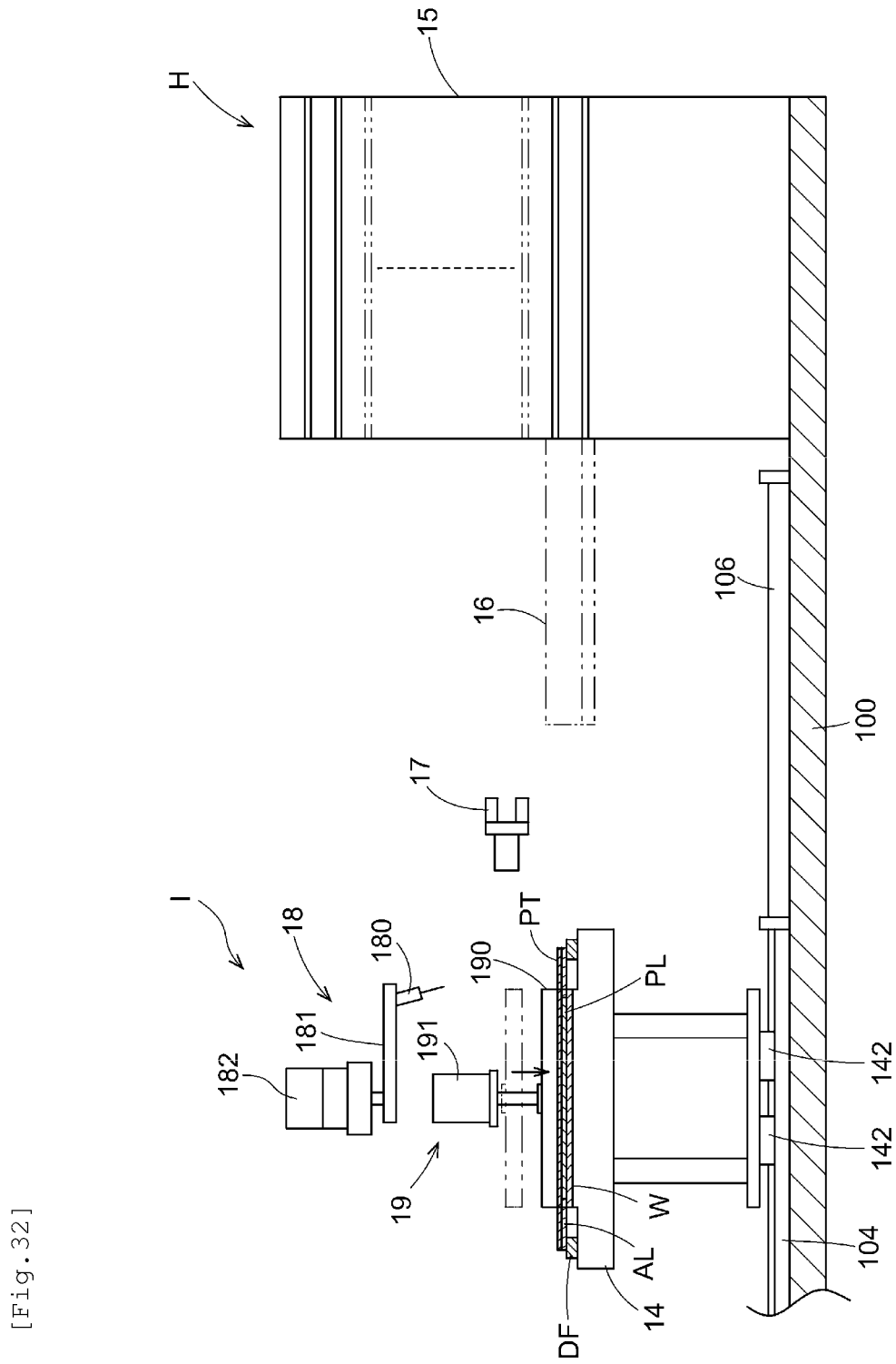
[Fig. 32]

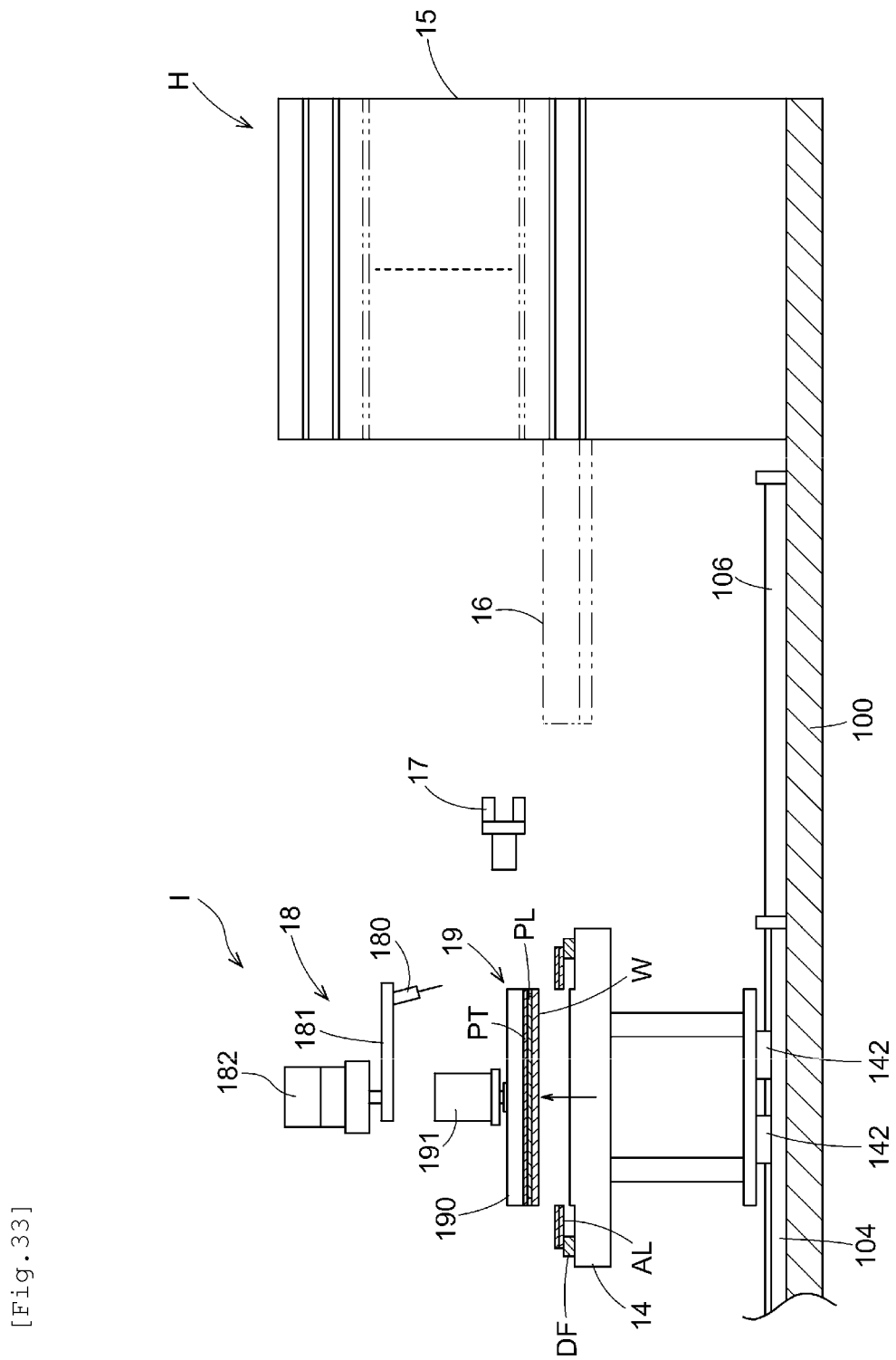
[Fig.33]

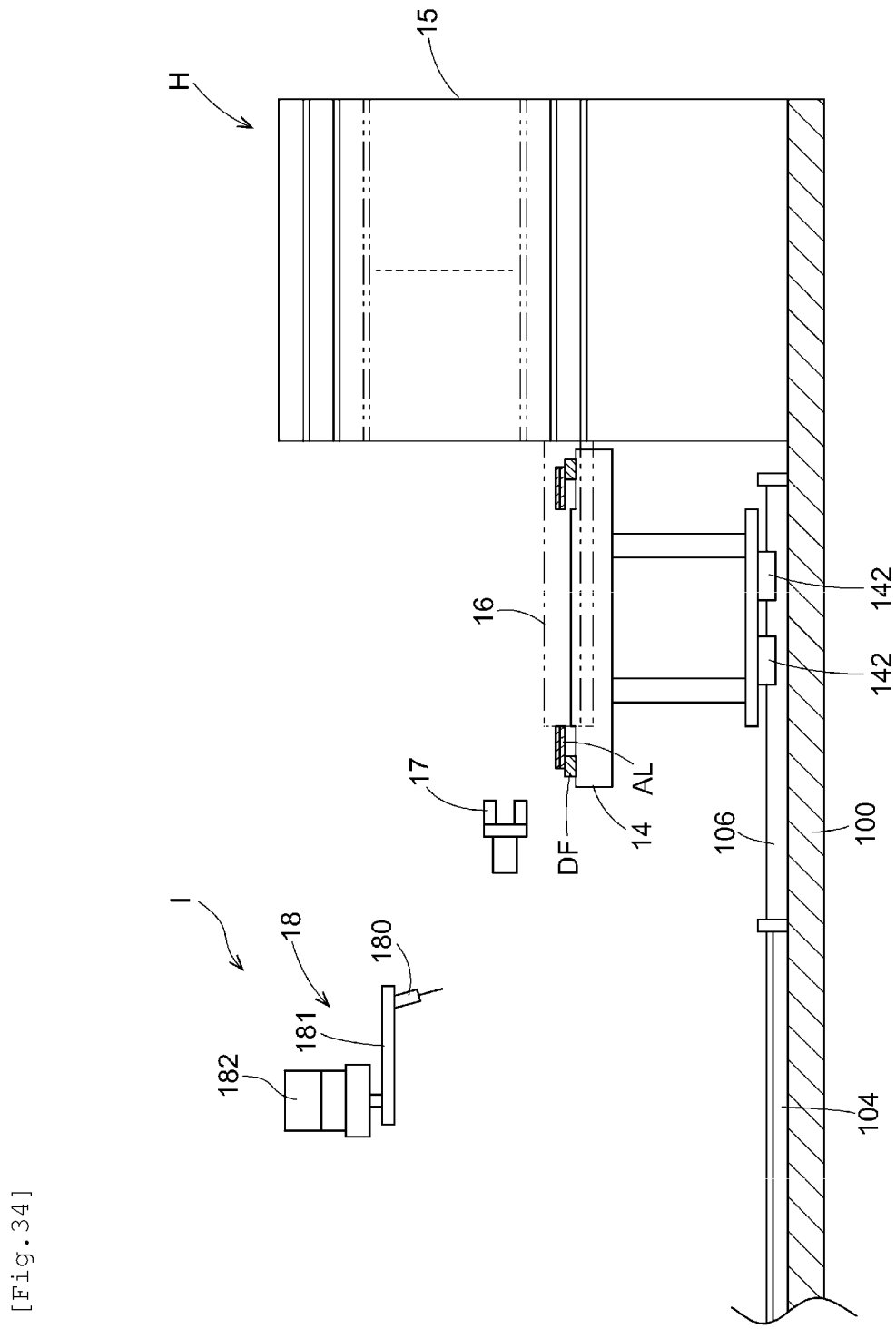
[Fig. 34]

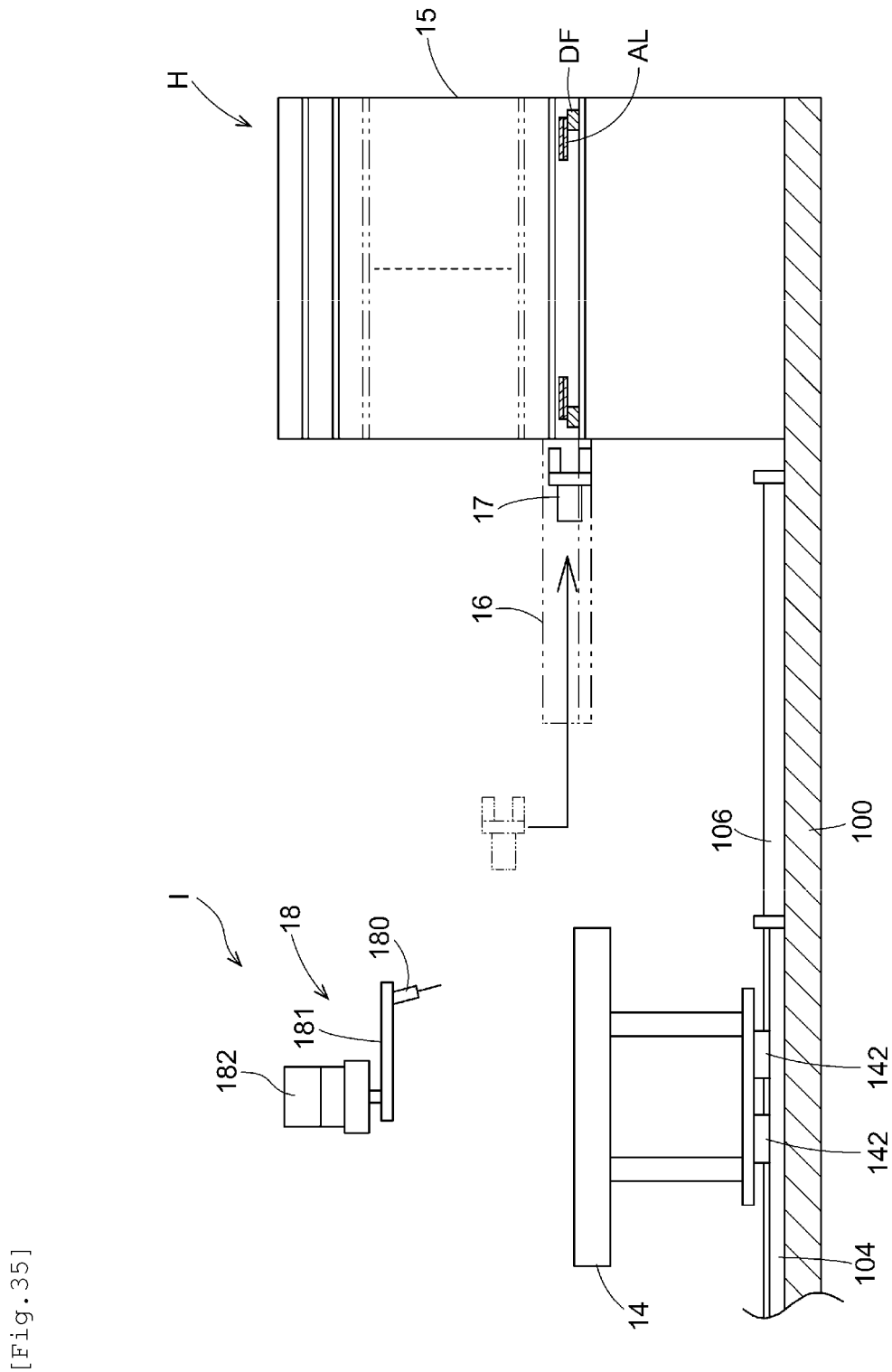
[Fig. 35]

DEVICE AND METHOD FOR ATTACHING PROTECTIVE TAPE TO SEMICONDUCTOR WAFER

CROSS-REFERENCE TO RELATED APPLICATIONS

This application is a U.S. National Stage application of PCT/JP2018/016543, filed 24 Apr. 2018, the entire disclosure of which is incorporated herein by reference.

TECHNICAL FIELD

The present invention relates to an application apparatus and an application method for applying a protective tape to a semiconductor wafer with low tension.

BACKGROUND ART

A process of manufacturing a semiconductor chip generally involves forming a circuit having irregularities on a front surface of a semiconductor wafer (hereinafter simply referred to as "wafer") and then, in order to satisfy the recent demand for downsizing the semiconductor chip, grinding a back surface on an opposite side of the front surface having the circuit formed thereon, to thereby reduce the wafer in thickness. When the wafer is reduced in thickness, a circuit forming portion is protected by applying a protective tape to the front surface of the wafer.

As a method of applying the protective tape to the front surface of the wafer, there has been proposed a method involving temporarily applying the protective tape, which is cut in advance in conformity with the shape of the wafer, to a band-shaped base material, causing the protective tape to adhere to a circumferential surface of an application roller while peeling the protective tape from the band-shaped base material with the application roller that rotates while pressing the protective tape, and then pressing the protective tape against the front surface of the wafer with the application roller, to thereby apply the protective tape to the front surface of the wafer (see, for example, Patent Literature 1).

CITATION LIST

Patent Literature

[PTL 1] JP 5828532 B2

SUMMARY OF INVENTION

Technical Problem

However, when the protective tape is caused to adhere to the circumferential surface of the application roller by pressing the protective tape with the rotating application roller as in Patent Literature 1, excessive tension is applied to the protective tape, and hence residual stress is generated on the protective tape. When the residual stress is generated on the protective tape, in the case where the wafer is reduced in thickness by grinding the back surface of the wafer having the protective tape applied thereto, there is a problem, for example, in that the wafer is warped or broken due to the residual stress on the protective tape.

The present invention has been made to solve the above-mentioned problem, and provides an application apparatus and an application method for applying a protective tape to a semiconductor wafer, in which residual stress generated on the protective tape can be reduced at a time of application of the protective tape to the semiconductor wafer.

Solution to Problem

In order to solve the above-mentioned problem, according to one embodiment of the present invention, there is provided an application apparatus for applying a protective tape to a semiconductor wafer, including: a tape conveyance mechanism configured to convey the protective tape temporarily applied to a base material to a peeling position; a tape holding body capable of holding the protective tape; a holding-body moving mechanism configured to move the tape holding body to the peeling position; and a peeling mechanism configured to peel the base material from the protective tape held by the tape holding body at the peeling position.

According to one preferred embodiment of the present invention, the application apparatus further includes a frame base configured to support a dicing frame on which the semiconductor wafer is mounted, in which the holding-body moving mechanism is configured to move the tape holding body above the frame base, to thereby apply the protective tape to the dicing frame.

According to one preferred embodiment of the present invention, the application apparatus further includes: an application table configured to support the semiconductor wafer; and a raising and lowering mechanism configured to raise and lower the application table, in which the frame base is arranged in a periphery of and above the application table, and in which the raising and lowering mechanism is configured to raise the application table, to thereby apply the protective tape to the semiconductor wafer.

Further, according to one preferred embodiment of the present invention, in the application apparatus, the base material has a band shape and has a plurality of protective tapes arranged on the base material at intervals along a conveyance direction of the base material. The peeling mechanism includes a peeling plate and a peeling plate moving mechanism configured to cause the peeling plate to reciprocate in the conveyance direction of the base material, the peeling mechanism being configured to peel the base material from the protective tape by moving the peeling plate in a direction opposite to the conveyance direction of the base material while folding back the base material with a distal end of the peeling plate.

Further, according to one preferred embodiment of the present invention, in the application apparatus, the tape holding body includes an adsorption member capable of adsorbing an entire surface of the protective tape.

Further, according to one preferred embodiment of the present invention, in the application apparatus, the holding-body moving mechanism includes an up-and-down moving mechanism configured to move the tape holding body in an up-and-down direction and a reciprocation mechanism configured to cause the tape holding body to reciprocate in an X direction along a horizontal surface and in a Y direction orthogonal to the X direction.

In order to solve the above-mentioned problem, according to one embodiment of the present invention, there is provided an application method of applying a protective tape to a semiconductor wafer, including: a tape conveyance step of conveying the protective tape temporarily applied to a base material to a peeling position; a holding-body moving step of moving a tape holding body capable of holding the protective tape to the peeling position; and a peeling step of peeling the base material from the protective tape held by the tape holding body at the peeling position.

Further, according to one preferred embodiment of the present invention, the application method further includes a tape application step of applying the protective tape to a dicing frame by moving the tape holding body above a frame base configured to support the dicing frame and of mounting the semiconductor wafer on the dicing frame through intermediation of the protective tape.

Advantageous Effects of Invention

According to the present invention, the base material is peeled by the peeling mechanism under a state in which the protective tape is held by the tape holding body. With this, the protective tape can be held with low tension so that residual stress does not remain. Further, even when the base material is peeled from the protective tape, a load applied to the protective tape can be extremely approximated to zero. As a result, the protective tape can be applied to the wafer under a state in which the residual stress is reduced. Therefore, when the wafer is reduced in thickness by grinding a back surface thereof, the wafer can be prevented from being warped or broken due to the residual stress on the protective tape.

BRIEF DESCRIPTION OF DRAWINGS

FIG. 1 is a plan view for illustrating a schematic configuration of an application apparatus.

FIG. 2 is a sectional view of a tape peeling section of FIG. 1 taken along the line I-I.

FIG. 3 is a plan view of a base material having a protective tape temporarily applied thereto.

FIG. 4 is a sectional view of FIG. 3 taken along the line II-II.

FIG. 5 is an explanatory view for illustrating a step of peeling the protective tape from the base material.

FIG. 6 is an explanatory view for illustrating the step of peeling the protective tape from the base material.

FIG. 7 is an explanatory view for illustrating the step of peeling the protective tape from the base material.

FIG. 8 is a front view for illustrating a schematic configuration of a first alignment device.

FIG. 9 is an explanatory view for illustrating an image pickup operation by image pickup means of the first alignment device.

FIG. 10 is a front view for illustrating a schematic configuration of a second alignment device.

FIG. 11 is a side view for illustrating the schematic configuration of the second alignment device.

FIG. 12 is an explanatory view for illustrating a step of applying the protective tape to a wafer.

FIG. 13 is an explanatory view for illustrating the step of applying the protective tape to the wafer.

FIG. 14 is an explanatory view for illustrating the step of applying the protective tape to the wafer.

FIG. 15 is an explanatory view for illustrating the step of applying the protective tape to the wafer.

FIG. 16 is an explanatory view for illustrating the step of applying the protective tape to the wafer.

FIG. 17 is an explanatory view for illustrating the step of applying the protective tape to the wafer.

FIG. 18 is a bottom view of a pressing member.

FIG. 19 are each an explanatory view for illustrating a pressing position by the pressing member when the protective tape is applied to the wafer.

FIG. 20 is a front view for illustrating schematic configurations of a heating table and a conveyance table.

FIG. 21 are each a partially enlarged sectional view of a dicing frame having the wafer mounted thereon placed on the heating table.

FIG. 22 is an explanatory view for illustrating a step of heating the dicing frame having the wafer mounted thereon.

FIG. 23 is an explanatory view for illustrating the step of heating the dicing frame having the wafer mounted thereon.

FIG. 24 is an explanatory view for illustrating a step of accommodating the heated dicing frame.

FIG. 25 is an explanatory view for illustrating the step of accommodating the heated dicing frame.

FIG. 26 is an explanatory view for illustrating the step of accommodating the heated dicing frame.

FIG. 27 is an explanatory view for illustrating the step of accommodating the heated dicing frame.

FIG. 28 is an explanatory view for illustrating the step of accommodating the heated dicing frame.

FIG. 29 is an explanatory view for illustrating a step of cutting the wafer from the heated dicing frame.

FIG. 30 is an explanatory view for illustrating the step of cutting the wafer from the heated dicing frame.

FIG. 31 is an explanatory view for illustrating the step of cutting the wafer from the heated dicing frame.

FIG. 32 is an explanatory view for illustrating a step of accommodating the wafer cut from the dicing frame.

FIG. 33 is an explanatory view for illustrating the step of accommodating the wafer cut from the dicing frame.

FIG. 34 is an explanatory view for illustrating a step of accommodating the dicing frame having the cut wafer.

FIG. 35 is an explanatory view for illustrating the step of accommodating the dicing frame having the cut wafer.

DESCRIPTION OF EMBODIMENTS

An object of the present invention is to, in an application apparatus and an application method for applying a protective tape to a semiconductor wafer (hereinafter simply referred to as "wafer"), reduce residual stress generated on the protective tape at a time of application of the protective tape to the wafer by peeling the protective tape formed into a predetermined shape in advance and temporarily applied to a base material from the base material under reduced tension, holding the peeled protective tape, and applying the protective tape to the wafer.

In order to achieve the above-mentioned object, the application apparatus according to the present invention includes: a tape conveyance mechanism configured to convey the protective tape temporarily applied to a base material to a peeling position; a tape holding body capable of holding the protective tape; a holding-body moving mechanism configured to move the tape holding body to the peeling position; and a peeling mechanism configured to peel the base material from the protective tape held by the tape holding body at the peeling position. The feature of the application apparatus according to the present invention is described mainly in a tape peeling section A in the following embodiment of the present invention. In the following, the embodiment of the present invention is described with reference to the accompanying drawings, but the present invention is not limited to only the embodiment described with reference to the accompanying drawings. Note that, in each figure, each thickness of a wafer W, a dicing frame DF, a protective tape PT, a base material BM, a protective layer PL, and a pressure-sensitive adhesive layer AL are drawn in an exaggerated manner for ease of understanding.

FIG. 1 is a plan view for schematically illustrating an entire configuration of an application apparatus 1 according to this embodiment. The application apparatus 1 includes the tape peeling section A configured to peel the protective tape PT temporarily applied to the base material BM from the base material BM, a tape alignment section B configured to position the protective tape PT, a wafer supply section C configured to accommodate a plurality of wafers W, a wafer alignment section D configured to position the wafer W, a frame supply section E configured to accommodate a plurality of dicing frames DF, a tape application section F configured to apply the protective tape PT to the wafer W and mount the wafer W on the dicing frame DF through intermediation of the protective tape PT, a heating section G configured to heat the wafer W mounted on the dicing frame DF, and a frame accommodating section H configured to accommodate the dicing frame DF after the wafer W is heated.

The application apparatus 1 further includes various devices configured to perform various operations in each section and convey the protective tape PT, the wafer W, the dicing frame DF, and the like between the sections, and a control device (not shown) configured to control operations of the various devices and process signals and data received from the various devices. The various devices and the control device are arranged on a machine base 100. The control device can be formed of, for example, a computer that includes a microcomputer, a memory, and an HDD, and has processing ability imparted by software.

First, as illustrated in FIG. 1 and FIG. 2, in order to peel the protective tape PT temporarily applied to the base material BM from the base material BM, the tape peeing section A includes a tape conveyance mechanism 2, a tape conveyance unit 3, and a peeling mechanism 4.

The tape conveyance mechanism 2 is configured to convey the protective tape PT temporarily applied to the base material BM to a peeling position. The tape conveyance mechanism 2 includes a supply roll 20 of the base material BM having the protective tape PT temporarily applied thereto, a recovery roll 21 of the base material BM having the protective tape PT peeled therefrom, and a plurality of guide rollers 22 configured to guide the base material BM. The supply roll 20 is configured to support the base material BM wound into a roll shape. The recovery roll 21 is configured to take up the base material BM. The base material BM is fed from the supply roll 20 to be conveyed through rotation drive of the recovery roll 21.

The base material BM is, for example, a PET film or a cardboard subjected to release treatment, and is fed from the supply roll 20 to be conveyed in a band shape. As illustrated in FIG. 1, FIG. 3, and FIG. 4, a plurality of protective tapes PT, each being cut into a circular shape in advance, are arranged on a front surface of the base material BM at predetermined intervals along a conveyance direction. In this embodiment, the protective tape PT has an outer diameter set to be larger than that of the wafer W. Further, the protective tape PT has a circular protective layer PL with an outer diameter smaller than that of the wafer W (for example, a diameter smaller by about 2 mm than that of the wafer W) formed on one surface and has a pressure-sensitive adhesive layer AL formed on the periphery of the protective layer PL. The protective layer PL is softened by heating to follow irregularities of the wafer W, thereby being brought into close contact therewith. Thus, the wafer W is ground to be flat when a back surface of the wafer W is ground in a subsequent step. Further, when the protective layer PL is peeled from the wafer W that has undergone a processing step, for example, back surface grinding, the protective layer PL can be peeled from the wafer W completely without any residual paste. Further, a part of the protective tape PT on an outer peripheral side is applied to an outer peripheral edge portion of the wafer W on an outer side from a circuit forming portion through intermediation of the pressure-sensitive adhesive layer AL, and the wafer W is protected when the circuit forming portion is covered with the protective layer PL.

As illustrated in FIG. 1 and FIG. 2, the tape conveyance unit 3 includes a tape holding body 30 capable of holding the protective tape PT and a holding-body moving mechanism 31 configured to move the tape holding body 30 onto the protective tape PT conveyed to the peeling position.

The tape holding body 30 is configured to hold the protective tape PT, which is conveyed to the peeling position by the tape conveyance mechanism 2, from a front surface side. In this embodiment, the tape holding body 30 holds the protective tape PT by adsorption and is formed of a fixing member 300 having a porous adsorption member 301 fixed thereto, for example, as illustrated in FIG. 7 and FIG. 8. A decompression pump (not shown), for example, a vacuum pump is connected to the adsorption member 301, and the adsorption member 301 can adsorb and hold the protective tape PT on a front surface thereof. In this embodiment, the adsorption member 301 has an outer diameter that is substantially equal to (equal to or somewhat larger than) that of the protective tape PT and holds an entire surface of the protective tape PT by adsorption.

As illustrated in FIG. 1 and FIG. 2, the holding-body moving mechanism 31 includes a first up-and-down moving mechanism 310 configured to cause the tape holding body 30 to reciprocate in a Z direction (up-and-down direction) along a vertical direction, a reciprocation mechanism (hereinafter referred to as "first reciprocation mechanism") 320 configured to cause the tape holding body 30 to reciprocate in an X direction (front-and-back direction) along a horizontal surface, and a reciprocation mechanism (hereinafter referred to as "second reciprocation mechanism") 330 configured to cause the tape holding body 30 to reciprocate in a Y direction (right-and-left direction) that is along the horizontal surface and orthogonal to the X direction.

The first up-and-down moving mechanism 310 is configured to move the tape holding body 30 in the up-and-down direction between the peeling position at which the tape holding body 30 holds the protective tape PT (see FIG. 6) and a separation position above the peeling position (see FIG. 5). There is no particular limitation on the first up-and-down moving mechanism 310 as long as the first up-and-down moving mechanism 310 moves the tape holding body 30 in the up-and-down direction.

As illustrated in FIG. 1 and FIG. 2, the first up-and-down moving mechanism 310 of this embodiment includes a ball screw configured to drive the tape holding body 30 so as to reciprocate, and a guide mechanism configured to guide reciprocation of the tape holding body 30. The ball screw and the guide mechanism are arranged on a support frame 317. The ball screw includes a screw shaft 311, a nut member 312, and a ball (not shown), and the nut member 312 is connected to the tape holding body 30 through intermediation of a connecting member 313. The ball screw uses a motor 314 as a drive source and converts forward and backward rotation of the motor 314 into reciprocating linear motion in a screw shaft direction to move the tape holding body 30 in the up-and-down direction. The guide mechanism includes a pair of right and left guide rails 315 extending in the up-and-down direction and a pair of right and left sliders 316 slidably mounted on the corresponding guide rails 315. The pair of guide rails 315 and the pair of sliders 316 are arranged so as to sandwich the ball screw therebetween. The pair of sliders 316 are arranged in a perpendicular portion of the connecting member 313, and the pair of guide rails 315 are arranged on the support frame 317. In the guide mechanism, each of the sliders 316 slides on the corresponding guide rail 315 to assist the tape holding body 30 to move straight in the Z direction (up-and-down direction).

As illustrated in FIG. 1 and FIG. 2, the first reciprocation mechanism 320 is configured to cause the tape holding body 30 to reciprocate in the X direction. In the tape peeling section A, the conveyance direction of the base material BM is directed in the X direction, and the first reciprocation mechanism 320 causes the tape holding body 30 to reciprocate in the conveyance direction of the base material BM to place the tape holding body 30 at the peeing position. There is no particular limitation on the first reciprocation mechanism 320 as long as the first reciprocation mechanism 320 causes the tape holding body 30 to reciprocate in the X direction. The first reciprocation mechanism 320 of this embodiment includes a rail 321 that is formed in a horizontal portion of the connecting member 313 and extends in the X direction and a slider 322 that is connected to a support member 32 and slidably mounted on the rail 321. The tape holding body 30 can reciprocate in the X direction along the rail 321 through intermediation of the slider 322 with a drive source (not shown).

As illustrated in FIG. 1 and FIG. 2, the second reciprocation mechanism 330 causes the tape holding body 30 to reciprocate in the Y direction orthogonal to the X direction. In the tape peeling section A, the Y direction crosses the conveyance direction of the base material BM, and the second reciprocation mechanism 330 causes the tape holding body 30 to reciprocate in the Y direction to place the tape holding body 30 at the peeling position. Further, the second reciprocation mechanism 330 causes the tape holding body 30 to reciprocate in the Y direction to convey the tape holding body 30 from the tape peeling section A to the tape alignment section B and the tape application section F in the stated order. There is no particular limitation on the second reciprocation mechanism 330 as long as the second reciprocation mechanism 330 causes the tape holding body 30 to reciprocate in the Y direction. The second reciprocation mechanism 330 of this embodiment includes a pair of upper and lower rails 331 extending in the Y direction and a pair of upper and lower sliders 332 slidably mounted on the corresponding rails 331. The pair of sliders 332 are arranged on a support member 333 fixed to the support frame 317, and the pair of rails 331 are arranged on a side plate 101 arranged upright on the machine base 100. The tape holding body 30 can reciprocate in the Y direction along the rails 331 through intermediation of the sliders 332 with a drive source (not shown).

As illustrated in FIG. 1 and FIG. 2, the peeling mechanism 4 is configured to peel the base material BM from the protective tape PT held by the tape holding body 30 of the tape conveyance unit 3 and includes a peeling plate 40 and a peeling plate moving mechanism 41 configured to cause the peeling plate 40 to reciprocate in the conveyance direction of the base material BM. The peeling plate 40 has a pointed edge at a distal end, and the base material BM to which the protective tape PT is temporarily applied is rapidly folded by the edge at the distal end of the peeling plate 40 after passing through a region on the peeling plate 40. The peeling plate 40 is supported on a pair of right and left support plates 42. A pair of front and back guide rollers 43 are rotatably laid between the pair of support plates 42. The base material BM that is folded by the edge at the distal end of the peeling plate 40 is guided by the pair of guide rollers 43 and taken up by the recovery roll 21 via the plurality of guide rollers 22.

As illustrated in FIG. 6 and FIG. 7, the peeling plate moving mechanism 41 is configured to peel the base material BM from the protective tape PT held by the tape holding body 30 by moving the peeling plate 40 at the peeling position in a direction opposite to the conveyance direction of the base material BM. There is no particular limitation on the peeling plate moving mechanism 41 as long as the peeling plate moving mechanism 41 causes the peeling plate 40 to reciprocate in the conveyance direction of the base material BM.

As illustrated in FIG. 1 and FIG. 2, the peeling plate moving mechanism 41 of this embodiment includes a ball screw configured to drive the peeling plate 40 so as to reciprocate and a guide mechanism configured to guide reciprocation of the peeling plate 40. The ball screw includes a screw shaft 410, a nut member 411, and a ball (not shown), and the nut member 411 is connected to the support plate 42 configured to support the peeling plate 40 through intermediation of a connecting member 412. The ball screw uses a motor 413 as a drive source and converts forward and backward rotation of the motor 413 into reciprocating linear motion in a screw shaft direction to cause the peeling plate 40 to reciprocate in the X direction. The guide mechanism includes a pair of right and left guide rails 414 extending in the X direction and a pair of right and left sliders 415 slidably mounted on the corresponding guide rails 414. The pair of guide rails 414 and the pair of sliders 415 are arranged so as to sandwich the peeling plate 40 therebetween. The pair of sliders 415 are arranged on the corresponding support plates 42, and the pair of guide rails 414 are arranged on a pair of side plates 102. The pair of side plates 102 are arranged upright on the machine base 100 so as to be opposed to each other at an interval. In the guide mechanism, each of the sliders 415 slides on the corresponding guide rail 414 to assist the peeling plate 40 to reciprocate straight in the X direction.

In the tape peeling section A, the entire surface of the protective tape PT conveyed to the peeling position by the tape conveyance mechanism 2 is held by the tape holding body 30, and the base material BM is peeled by the peeling mechanism 4 under a state in which the entire surface of the protective tape PT is held by the tape holding body 30. Then, the tape holding body 30 holding the protective tape PT is conveyed to the tape alignment section B and the tape application section F in the stated order by the holding-body moving mechanism 31.

Next, as illustrated in FIG. 1, the tape alignment section B includes a first alignment device 5 in order to position the protective tape PT conveyed from the tape peeling section A while being held by the tape holding body 30. The first alignment device 5 is configured to position the protective tape PT by detecting an outer peripheral edge portion of the protective layer PL of the protective tape PT.

As illustrated in FIG. 8, the first alignment device 5 includes image pickup means 50 for imaging the outer peripheral edge portion of the protective layer PL, illumination means 51 for illuminating a part of the outer peripheral edge portion of the protective layer PL to be imaged by the image pickup means 50, and an image pickup means moving mechanism 52 configured to cause the image pickup means 50 to reciprocate in the X direction along the horizontal surface and the Y direction orthogonal to the X direction.

As the image pickup means 50, for example, a CCD camera or a C-MOS camera is used. In order to image a plurality of parts (preferably four parts) of the outer peripheral edge portion of the protective layer PL, a plurality of image pickup means 50 may be respectively arranged at a plurality of parts in a concentric shape corresponding to the outer peripheral edge portion of the protective layer PL. However, in this embodiment, as illustrated in FIG. 9, a plurality of parts (four parts in FIG. 9) of the outer peripheral edge portion of the protective layer PL are imaged with one image pickup means 50 by moving the one image pickup means 50 with the image pickup means moving mechanism 52. When the image pickup means 50 images the plurality of parts of the outer peripheral edge portion of the protective layer PL, the image pickup means 50 outputs the image data thereof to a control device (not shown).

Further, as illustrated in FIG. 8, the image pickup means 50 is supported by a perpendicular rail 54 arranged upright on a support base 53 through intermediation of a raising and lowering member 55. The image pickup means 50 can be raised and lowered by moving the raising and lowering member 55 in the up-and-down direction (Z direction) through use of a cylinder or the like.

As illustrated in FIG. 8, the illumination means 51 is supported by a guide 56 arranged upright on the support base 53 so as to move upward and downward through use of appropriate drive means (not shown). The illumination means 51 includes a light-emitting portion 510, for example, a light-emitting diode as a light source and has the light-emitting portion 510 fixed in a light-guiding member 511. The illumination means 51 performs ring illumination for emitting light in a ring shape and has, for example, a plurality of light-emitting portions 510 arranged in a circumferential shape.

As illustrated in FIG. 8, the image pickup means moving mechanism 52 includes a reciprocation mechanism (hereinafter referred to as "third reciprocation mechanism") 520 configured to cause the image pickup means 50 to reciprocate in the X direction along the horizontal surface and a reciprocation mechanism (hereinafter referred to as "fourth reciprocation mechanism") 530 configured to cause the image pickup means 50 to reciprocate in the Y direction that is along the horizontal surface and orthogonal to the X direction.

There is no particular limitation on the third reciprocation mechanism 520 as long as the third reciprocation mechanism 520 causes the image pickup means 50 to reciprocate in the X direction. The third reciprocation mechanism 520 of this embodiment includes a ball screw configured to drive the image pickup means 50 so as to reciprocate in the X direction and a guide mechanism configured to guide reciprocation of the image pickup means 50 in the X direction. The ball screw includes a screw shaft 521, a nut member 522, and a ball (not shown), and the nut member 522 is connected to the support plate 53 configured to support the image pickup means 50 through intermediation of a connecting member 523. The ball screw uses a motor (not shown) as a drive source and converts forward and backward rotation of the motor into reciprocating linear motion in a screw shaft direction to cause the image pickup means 50 to reciprocate in the X direction. The guide mechanism includes a pair of right and left guide rails 524 extending in the X direction and a pair of right and left sliders 525 slidably mounted on the corresponding guide rails 524. The pair of guide rails 524 and the pair of sliders 525 are arranged so as to sandwich the ball screw therebetween. Each of the sliders 525 is arranged on the connecting member 523, and each of the guide rails 524 is arranged on a support plate 526 extending in the Y direction. In the guide mechanism, each of the sliders 525 slides on the corresponding guide rail 524 to assist the image pickup means 50 to reciprocate straight in the X direction.

There is no particular limitation on the fourth reciprocation mechanism 530 as long as the fourth reciprocation mechanism 530 causes the image pickup means 50 to reciprocate in the Y direction. The fourth reciprocation mechanism 530 of this embodiment includes a ball screw configured to drive the image pickup means 50 so as to reciprocate in the Y direction and a guide mechanism configured to guide reciprocation of the image pickup means 50 in the Y direction. The ball screw includes a screw shaft 531, a nut member 532, and a ball (not shown), and the nut member 532 is connected to the support plate 53 configured to support the image pickup means 50 through intermediation of the support plate 526 and the connecting member 523. The ball screw uses a motor 533 as a drive source and converts forward and backward rotation of the motor 533 into reciprocating linear motion in a screw shaft direction to cause the image pickup means 50 to reciprocate in the Y direction. The guide mechanism includes a pair of right and left guide rails 534 extending in the Y direction and a plurality of pairs of right and left sliders 535 slidably mounted on the corresponding guide rails 534. The pair of guide rails 534 and the pair of sliders 535 are arranged so as to sandwich the ball screw therebetween. Each of the sliders 535 is arranged on the support plate 526, and each of the guide rails 534 is arranged on a support frame 536 extending in the Y direction. In the guide mechanism, each of the sliders 535 slides on the corresponding guide rail 534 to assist the image pickup means 50 to reciprocate straight in the Y direction.

In the tape alignment section B, the image pickup means 50 images a plurality of parts of the outer peripheral edge portion of the protective layer PL. A control device (not shown) processes image data acquired from the image pickup means 50 to obtain positional information on the plurality of parts of the outer peripheral edge portion of the protective layer PL, to thereby calculate a center position of the protective layer PL. Then, the control device (not shown) compares the center position of the protective layer PL to a predefined reference position of a center of the protective layer PL and controls the holding-body moving mechanism 31 based on a positional displacement amount between the center position and the reference position, to thereby correct the position of the tape holding body 30 in the X direction and the Y direction and align the center of the protective layer PL with the reference position. The protective tape PT subjected to positioning is conveyed to the tape application section F by the holding-body moving mechanism 31 under a state of being held by the tape holding body 30.

Next, as illustrated in FIG. 1, the wafer supply section C includes an accommodating cassette 10 capable of accommodating a plurality of wafers W in a stacked state. The accommodating cassette 10 can be raised and lowered through use of a raising and lowering mechanism (not shown), for example, an elevator mechanism. In the wafer supply section C, the accommodating cassette 10 is raised and lowered every time the wafer W is taken out by a first wafer conveyance mechanism 7, and the plurality of wafers W are successively supplied to the first wafer conveyance mechanism 7.

As illustrated in FIG. 1, in this embodiment, the first wafer conveyance mechanism 7 is a robot arm and includes an articulated arm 70 and a hand 71 formed at a distal end of the arm 70. The arm 70 includes a plurality of links 72 pivotably coupled to each other, and the link 72 at a proximal end is pivotably coupled to a shaft 73. In this embodiment, the hand 71 is an adsorption-type hand capable of holding the wafer W by adsorption. The hand 71 holds the wafer W by adsorbing a front surface of the wafer W and is configured to adsorb an outer peripheral portion of the front surface of the wafer W in which a pattern is not formed. In the first wafer conveyance mechanism 7, the wafers W are successively taken out one by one from the wafer supply section C by the hand 71, and then the wafer W held by the hand 71 is conveyed and supplied to the wafer alignment section D and the tape application section F in the stated order by expansion and contraction, and pivoting of the arm 70. As the hand 71, a non-contact hand capable of holding the wafer W in a non-contact manner may be used.

Next, as illustrated in FIG. 1, the wafer alignment section D includes a second alignment device 8 in order to position the wafer W conveyed by the first wafer conveyance mechanism 7. The second alignment device 8 is configured to position the wafer W by detecting the outer peripheral edge portion of the wafer W.

As illustrated in FIG. 10 and FIG. 11, the second alignment device 8 includes a rotary table 80 having a diameter smaller than that of the wafer W, a rotation drive mechanism 81 configured to rotate the rotary table 80, a table moving mechanism 82 configured to cause the rotary table 80 to reciprocate in the X direction along the horizontal surface and the Y direction orthogonal to the X direction, illumination means 83 for illuminating the wafer W with red light from one surface side (lower side in the illustrated example) of the wafer W, and image pickup means 84 for imaging the wafer W on the other surface side (upper side in the illustrated example) of the wafer W.

The rotary table 80 is configured to place and hold the wafer W on an upper surface thereof. In this embodiment, the rotary table 80 is configured to hold the wafer W by adsorption. The rotary table 80 is rotatably supported by a support frame 801 through intermediation of a rotary shaft 800.

There is no particular limitation on the rotation drive mechanism 81 as long as the rotation drive mechanism 81 rotates the rotary table 80. The rotation drive mechanism 81 of this embodiment includes a motor 810 serving as a drive source, a drive pulley 811 connected to the motor 810, a driven pulley 812 mounted on the rotary shaft 800, and a belt 813 stretched between the drive pulley 811 and the driven pulley 812. Those components are arranged on the support frame 801.

The table moving mechanism 82 includes a reciprocation mechanism (hereinafter referred to as "fifth reciprocation mechanism") 820 configured to cause the rotary table 80 to reciprocate in the X direction along the horizontal surface and a reciprocation mechanism (hereinafter referred to as "sixth reciprocation mechanism") 830 configured to cause the rotary table 80 to reciprocate in the Y direction that is along the horizontal surface and orthogonal to the X direction.

There is no particular limitation on the fifth reciprocation mechanism 820 as long as the fifth reciprocation mechanism 820 causes the rotary table 80 to reciprocate in the X direction. The fifth reciprocation mechanism 820 of this embodiment includes a ball screw configured to drive the rotary table 80 so as to reciprocate in the X direction and a guide mechanism configured to guide reciprocation of the rotary table 80 in the X direction. The ball screw includes a screw shaft 821, a nut member 822, and a ball (not shown), and the nut member 822 is connected to the support frame 801 configured to support the rotary table 80. The ball screw uses a motor 823 as a drive source and converts forward and backward rotation of the motor 823 into reciprocating linear motion in a screw shaft direction to cause the rotary table 80 to reciprocate in the X direction. The guide mechanism includes a guide rail 824 extending in the X direction and a pair of sliders 825 slidably mounted on the guide rail 824. Each of the sliders 825 is arranged on the support frame 801, and the guide rail 824 is arranged on a support base 802. In the guide mechanism, each of the sliders 825 slides on the corresponding guide rail 824 to assist the rotary table 80 to reciprocate straight in the X direction.

There is no particular limitation on the sixth reciprocation mechanism 830 as long as the sixth reciprocation mechanism 830 causes the rotary table 80 to reciprocate in the Y direction. The sixth reciprocation mechanism 830 of this embodiment includes a ball screw configured to drive the rotary table 80 so as to reciprocate in the Y direction and a guide mechanism configured to guide reciprocation of the rotary table 80 in the Y direction. The ball screw includes a screw shaft 831, a nut member 832, and a ball (not shown), and the nut member 832 is connected to the support frame 801 configured to support the rotary table 80 through intermediation of the support base 802. The ball screw uses a motor 833 as a drive source and converts forward and backward rotation of the motor 833 into reciprocating linear motion in a screw shaft direction to cause the rotary table 80 to reciprocate in the Y direction. The guide mechanism includes a guide rail 834 extending in the Y direction and a pair of sliders 835 slidably mounted on the guide rail 834. Each of the sliders 835 is arranged on the support base 802, and the guide rail 834 is arranged on a support base 803. In the guide mechanism, each of the sliders 835 slides on the corresponding guide rail 834 to assist the rotary table 80 to reciprocate straight in the Y direction.

The illumination means 83 is supported by a support plate 804 at a lower position of the rotary table 80. The illumination means 83 has an outer shape formed to be larger than that of the wafer W and is configured to emit red light in a ring shape. It is preferred that red light to be emitted have a wavelength region of from about 580 nm to about 680 nm, and red light having a peak wavelength of 630 nm be used. Through use of red light having a wavelength region of from about 580 nm to about 680 nm, red light is blocked by the wafer W irrespective of the material for the wafer W. Therefore, the outer peripheral edge portion of the wafer W can be accurately detected by confirming a reception state of red light by the image pickup means 84. The illumination means 83 includes a light-emitting portion (not shown), for example, a red light-emitting diode as a light source and has, for example, a plurality of light-emitting portions arranged in a circumferential shape.

As the image pickup means 84, for example, a CCD camera or a C-MOS camera is used. The image pickup means 84 is arranged on the rotary shaft 800 of the rotary table 80 in order to image the outer peripheral edge portion of the wafer W as a whole. The image pickup means 84 includes an optical filter 840. The optical filter 840 has a feature of transmitting only red light without transmitting light other than light having a wavelength region of red light with which the illumination means 83 illuminates the wafer W among visible light that enters the image pickup means 84. As the optical filter 840, a filter that blocks light having a wavelength of 600 nm or less can be preferably used. The image pickup means 84 is configured to image the outer peripheral edge portion of the wafer W and output an image signal thereof to a control device (not shown).

In the wafer alignment section D, while the rotary table 80 rotates the wafer W, and the illumination means 83 illuminates the wafer W with red light, the image pickup means 84 images the outer peripheral edge portion of the wafer W, and the control device (not shown) processes image data acquired from the image pickup means 84 to detect the outer peripheral edge portion of the wafer W, to thereby calculate a center position of the wafer W. Then, the control device (not shown) compares the center position of the wafer W to a predefined reference position of a center of the wafer W and controls the table moving mechanism 82 based on a positional displacement amount between the center position and the reference position, to thereby correct the position of the rotary table 80 in the X direction and the Y direction and align the center of the wafer W with the reference position. The wafer W subjected to positioning is conveyed to the tape application section F by the first wafer conveyance mechanism 7.

Next, as illustrated in FIG. 1 and FIG. 2, the frame supply section E includes an accommodating cassette 11 capable of accommodating the plurality of dicing frames DF in a stacked state. The accommodating cassette 11 can raise and lower each of the dicing frames DF through use of a raising and lowering mechanism (not shown), for example, an elevator mechanism. In the frame supply section E, the dicing frame DF is raised and lowered every time the dicing frame DF is taken out to a first conveyance arm 9A so that the plurality of dicing frames DF are successively supplied to the first conveyance arm 9A. It is preferred that the dicing frame DF be positioned by appropriate positioning means in advance.

As illustrated in FIG. 1, the first conveyance arm 9A can reciprocate between the frame supply section E and the tape application section F along a rail 103 extending in the Y direction with a drive source (not shown). The rail 103 is laid on the machine base 100. The first conveyance arm 9A can hold the dicing frame DF by adsorption and includes a plurality of adsorption portions 90, for example, adsorption pads. The first conveyance arm 9A successively takes out the dicing frames DF one by one from the frame supply section E with the adsorption portions 90 and then conveys and supplies the dicing frames DF to the tape application section F.

Next, as illustrated in FIG. 1, the tape application section F includes a vacuum chamber 6 in order to apply the protective tape PT to the wafer W and mount the wafer W on the dicing frame DF through intermediation of the protective tape PT under a decompressed state. As illustrated in FIG. 12 to FIG. 17, in the vacuum chamber 6, there are arranged an application table 60 configured to support the wafer W, a frame base 61 configured to support the dicing frame DF on which the wafer W is mounted, and a pressing member 62 configured to press the protective tape PT supplied to the wafer W by the tape holding body 30 from above.

The vacuum chamber 6 includes a lower chamber 6B fixed to the machine base 100 and an upper chamber 6A arranged on the lower chamber 6B so as to move upward and downward, and the upper chamber 6A and the lower chamber 6B are combined to form the vacuum chamber 6. The application table 60 and the frame base 61 are arranged in the lower chamber 6B, and the pressing member 62 is arranged in the upper chamber 6A.

As illustrated in FIG. 17, the upper chamber 6A is supported by a support plate 63 through intermediation of a plurality of guide members 64 so as to move upward and downward. Further, a cylinder shaft 650 of a raising and lowering cylinder 65 arranged on the support plate 63 is connected to the upper chamber 6A, and through drive of the raising and lowering cylinder 65, the upper chamber 6A moves in the up-and-down direction between a coupling position at which the upper chamber 6A is combined with the lower chamber 6B and a separation position above the lower chamber 6B.

Further, a vacuum adaptor 66 is connected to the upper chamber 6A, and the vacuum adaptor 66 is connected to a decompression pump (not shown), for example, a vacuum pump. When the upper chamber 6A is combined with the lower chamber 6B to form the vacuum chamber 6, the vacuum chamber 6 can be brought into a decompressed state through exhaust from the vacuum adaptor 66. Further, the decompressed state in the vacuum chamber 6 can be cancelled by introducing air through the vacuum adaptor 66. The vacuum chamber 6 can also be brought into an inert gas atmosphere by decompressing the vacuum chamber 6 and then introducing inert gas such as argon or nitrogen into the vacuum chamber 6.

As illustrated in FIG. 12 to FIG. 17, the application table 60 has a porous adsorption member 600 formed on an upper surface thereof. The adsorption member 600 has a decompression pump, for example, a vacuum pump connected thereto and hence can adsorb and hold the wafer W on the upper surface thereof. The wafer W is placed on the application table 60 by the first wafer conveyance mechanism 7.

The application table 60 can be raised and lowered in the lower chamber 6B by a raising and lowering mechanism 67 while supporting the wafer W. There is no particular limitation on the raising and lowering mechanism 67 as long as the raising and lowering mechanism 67 raises and lowers the application table 60. As illustrated in FIG. 12 to FIG. 17, the raising and lowering mechanism 67 of this embodiment includes a guide member 670 configured to support the application table 60 so that the application table 60 can be raised and lowered with respect to the lower chamber 6B, a support plate 671 to which the guide member 670 is fixed, a ball screw including a screw shaft 672, a nut member 673, and a ball (not shown), a motor 674 configured to drive the ball screw, a drive pulley 675 connected to the motor 674, a driven pulley 676 mounted on the screw shaft 672, and a belt 677 stretched between the drive pulley 675 and the driven pulley 676. The support plate 671 is connected to the nut member 673, and the raising and lowering mechanism 67 converts forward and backward rotation of the motor 674 into reciprocating linear motion in a screw shaft direction with the ball screw to raise and lower the application table 60. The application table 60 is usually positioned below the frame base 61 at a predetermined interval.

As illustrated in FIG. 12 to FIG. 17, the frame base 61 is positioned so as to surround the application table 60 on an outer side thereof. The frame base 61 has an annular shape, and the application table 60 can pass through an opening of the frame base 61 at a time of being raised and lowered. The dicing frame DF is placed on the frame base 61 by the first conveyance arm 9A and fixed thereto by appropriate fixing means (not shown). Further, the protective tape PT is placed on the dicing frame DF by the tape holding body 30 to be supplied to the wafer W.

As illustrated in FIG. 12 to FIG. 19, in order to apply the protective tape PT to the wafer W and mount the wafer W on the dicing frame DF through intermediation of the protective tape PT, the pressing member 62 includes a protective layer outer periphery retainer 620 configured to press a peripheral portion of the protective layer PL of the protective tape PT to apply the protective tape PT to the wafer W, a tape outer periphery retainer 621 configured to press an outer peripheral edge portion of the protective tape PT to apply the protective tape PT to the dicing frame DF, and elastic members 622 configured to support the tape outer periphery retainer 621 so that the tape outer periphery retainer 621 can be displaced in the up-and-down direction.

The protective layer outer periphery retainer 620 has a ring shape and has an outer diameter set to be larger than that of the protective layer PL of the protective tape PT. As the protective layer outer periphery retainer 620, for example, a fluoro-rubber or a rubber material having a surface subjected to fluorine treatment can be used. The protective layer outer periphery retainer 620 is held by a first holder 624. The first holder 624 is fixed to a support disc 623, and the protective layer outer periphery retainer 620 is fitted in an annular concave portion formed in a ring-shaped convex portion 625 formed on an outer peripheral edge portion.

The tape outer periphery retainer 621 has a ring shape and has an outer diameter set to be substantially equal to that of the protective tape PT. The tape outer periphery retainer 621 can be made of, for example, a silicone resin. The tape outer periphery retainer 621 is held by a second holder 626. The second holder 626 is formed of an annular plate material, and the tape outer periphery retainer 621 is fixed to an annular groove formed in an outer peripheral edge portion of the second holder 626.

Further, the second holder 626 is supported by a plurality of mounting members 627 fixed to the support disc 623 through use of the elastic members 622, for example, springs. With this, when the tape outer periphery retainer 621 presses the outer peripheral edge portion of the protective tape PT to apply the protective tape PT to the dicing frame DF, pressing force of the tape outer periphery retainer 621 can be made constant.

The pressing member 62 can be moved upward and downward in the upper chamber 6A by a second up-and-down moving mechanism 68. There is no particular limitation on the second up-and-down moving mechanism 68 as long as the second up-and-down moving mechanism 68 moves the pressing member 62 in the up-and-down direction. The second up-and-down moving mechanism 68 of this embodiment includes a guide member 680 configured to support the pressing member 62 so that the pressing member 62 can move upward and downward with respect to the upper chamber 6A, a raising and lowering plate 681 to which the guide member 680 is fixed, raising and lowering cylinders 682, which are arranged on the upper chamber 6A and each have a cylinder shaft 683 connected to the raising and lowering plate 681, and a guide mechanism, which is configured to guide up-and-down movement of the pressing member 62 and includes a plurality of guide rails 684 and a plurality of sliders 685. The guide rails 684 are arranged on the upper chamber 6A so as to extend in the up-and-down direction, and the sliders 685 are arranged on the raising and lowering plate 681 and slidably mounted on the corresponding guide rails 684. The second up-and-down moving mechanism 68 is configured to drive up-and-down movement of the pressing member 62 with the raising and lowering cylinders 682 and guide up-and-down movement of the pressing member 62 with the guide mechanism.

In the tape application section F, under a decompressed state in the vacuum chamber 6, the irregularities in the circuit forming portion of the wafer W are covered with the protective layer PL by applying the peripheral portion of the protective layer PL of the protective tape PT to the outer peripheral edge portion of the wafer W through intermediation of the pressure-sensitive adhesive layer AL through use of the protective layer outer periphery retainer 620 of the pressing member 62. Further, the wafer W is mounted on the dicing frame DF through intermediation of the protective tape PT by applying the outer peripheral edge portion of the protective tape PT to the dicing frame DF through intermediation of the pressure-sensitive adhesive layer AL through use of the tape outer periphery retainer 621 of the pressing member 62 (see FIG. 21(a)). The dicing frame DF having the wafer W mounted thereon is conveyed to the heating section G by a second conveyance arm 9B.

As illustrated in FIG. 1, the second conveyance arm 9B can reciprocate between the tape application section F and the heating section G along the rail 103 extending in the Y direction with a drive source (not shown). The second conveyance arm 9B can hold the dicing frame DF by adsorption and includes a plurality of adsorption portions 90, for example, adsorption pads in the same manner as in the first conveyance arm 9A. The second conveyance arm 9B takes out the dicing frame DF having the wafer W mounted thereon from the tape application section F with the adsorption portions 90 and then conveys and supplies the dicing frame DF to the heating section G.

As illustrated in FIG. 1, the heating section G includes a heating table 12 configured to heat the dicing frame DF, a reverse arm 13 configured to hold the dicing frame DF and vertically reverse the held dicing frame DF, and a conveyance table 14 configured to convey the dicing frame DF after being heated to the frame accommodating section H.

As illustrated in FIG. 20, the heating table 12 enables the dicing frame DF to be placed on an upper surface thereof and fixed thereto with appropriate fixing means (not shown). A circular convex portion 121 is formed on a center region of the upper surface of the heating table 12, and the dicing frame DF is placed on and fixed to the heating table 12 so that the wafer W is positioned on the convex portion 121 as illustrated in FIG. 21(a). The heating table 12 contains a heater 120, and the protective tape PT is heated by the heater 120.

The heating table 12 is supported by a table base 122 having a space therein. The table base 122 can travel on a pair of rails 104 laid on the machine base 100 and extending in the X direction through intermediation of a pair of sliders 123. The heating table 12 can reciprocate in the X direction along the rails 104 through use of, for example, a motor 124 and a ball screw 125 as a drive source.

As illustrated in FIG. 1, the reverse arm 13 can hold the dicing frame DF by adsorption and includes a plurality of adsorption portions 130, for example, adsorption pads. The reverse arm 13 is supported by a support frame 131 so as to move in the up-and-down direction through use of a drive source (not shown). The support frame 131 can travel on a rail 105 laid on the machine base 100 and extending in the X direction through intermediation of a slider (not shown), and the reverse arm 13 can reciprocate in the X direction along the rail 105 with a drive source (for example, a motor and a ball screw) (not shown).

Further, a motor 132 is connected to the reverse arm 13, and the reverse arm 13 is rotated by drive of the motor 132. When the reverse arm 13 is turned upside down with the adsorption portions 130 facing upward, the reverse arm 13 can receive the dicing frame DF conveyed by the second conveyance arm 9B from the second conveyance arm 9B (see FIG. 22). After receiving the dicing frame DF from the second conveyance arm 9B, the reverse arm 13 is rotated in a normal direction with the adsorption port ions 130 facing downward. With this, the reverse arm 13 can place the dicing frame DF on the heating table 12 under a state in which the protective tape PT serves as a lower surface (see FIG. 23).

As illustrated in FIG. 1 and FIG. 20, the conveyance table 14 enables the dicing frame DF to be placed on an upper surface thereof and is configured to convey the dicing frame DF heated in the heating section G to the frame accommodating section H. The conveyance table 14 is supported by a plurality of support columns 141 arranged upright on a support base 140. The conveyance table 14 can travel on a pair of rails 106 laid on the machine base 100 and extending in the X direction through intermediation of a pair of sliders 142 arranged on the support base 140, and can reciprocate in the X direction along the rails 106 through use of, for example, a motor 143 and a ball screw 144 as a drive source. Further, the conveyance table 14 can pass through the inner space of the table base 122.

In the heating section G, the protective tape PT is heated, for example, at 100° C. for about 1 minute by the heating table 12 to soften the protective layer PL as illustrated in FIG. 21(b), and the protective layer PL is embedded in the irregularities in the circuit forming portion of the wafer W to be brought into close contact therewith. Then, the dicing frame DF is conveyed to the frame accommodating section H by the conveyance table 14.

Next, as illustrated in FIG. 1, the frame accommodating section H includes an accommodating cassette 15 capable of accommodating the plurality of dicing frames DF in a stacked state. The accommodating cassette 15 can be raised and lowered through use of a raising and lowering mechanism (not shown), for example, an elevator mechanism. In the frame accommodating section H, the accommodating cassette 15 is raised and lowered every time the dicing frame DF is accommodated so that the plurality of dicing frames DF are successively accommodated.

Further, as illustrated in FIG. 1, the frame accommodating section H includes a pair of conveyance rails 16 connected to the accommodating cassette 15 and a frame pusher 17 that reciprocates along a rail 107 parallel to the conveyance rails 16.

The frame pusher 17 can travel on the rail 107 laid on the machine base 100 and extending in the X direction through intermediation of a slider 170 and can reciprocate in the X direction along the rail 107 with a drive source (for example, a motor and a ball screw) (not shown). Further, the frame pusher 17 is supported so as to move in the up-and-down direction through use of the drive source (not shown). When the frame pusher 17 pushes the dicing frame DF on the conveyance table 14 moved to the vicinity of the conveyance rails 16 toward the accommodating cassette 15, the dicing frame DF is conveyed from the conveyance rails 16 to the accommodating cassette 15 and accommodated in the accommodating cassette 15.

Next, an application method of applying the protective tape PT to the wafer W is described.

First, prior to an application operation, the wafer W is taken out from the wafer supply section C illustrated in FIG. 1 by the first wafer conveyance mechanism 7, and then the wafer W is conveyed to the wafer alignment section D to be placed on the rotary table 80.

In the wafer alignment section D, the wafer W is aligned. First, the wafer W is rotated while being supported on the rotary table 80, and under a state in which the wafer W is illuminated with red light from one surface side of the wafer W by the illumination means 83, the wafer W is imaged from the other surface side of the wafer W by the image pickup means 84. An outer peripheral edge portion of the wafer W is detected based on a reception state of red light by the image pickup means 84, and a center position of the wafer W is calculated. The wafer W is subjected to position adjustment to position the center of the wafer W at a predetermined reference position. Then, the positioned wafer W is conveyed from the rotary table 80 to the tape application section F by the first wafer conveyance mechanism 7, and the wafer W is placed on and fixed to the application table 60 in the lower chamber 6B under a state of being positioned on the application table 60 as illustrated in FIG. 13. In this case, the center position of the wafer W placed on the application table 60 is matched with the center position of the dicing frame DF to be placed on the frame base 61 described later.

Further, the dicing frame DF is taken out from the frame supply section E illustrated in FIG. 1 by the first conveyance arm 9A and then conveyed to the tape application section F to be placed on and fixed to the frame base 61 in the lower chamber 6B as illustrated in FIG. 13.

Further, in the tape peeling section A illustrated in FIG. 1, the protective tape PT temporarily applied to the base material BM is conveyed to a peeling position by the tape conveyance mechanism 2, and the tape holding body 30 is moved onto the protective tape PT conveyed to the peeling position as illustrated in FIG. 5 so that the tape holding body 30 holds the protective tape PT. Then, as illustrated in FIG. 6 and FIG. 7, the peeling plate 40 is moved to peel the base material BM from the protective tape PT held by the tape holding body 30. After that, the protective tape PT peeled from the base material BM is conveyed to the tape alignment section B while being held by the tape holding body 30.

In the tape alignment section B, the protective tape PT is aligned. First, under a state in which the protective tape PT is held by the tape holding body 30, a plurality of parts (preferably four parts) of an outer peripheral edge portion of the protective layer PL of the protective tape PT are imaged by the image pickup means 50. Positional information on the plurality of parts of the outer peripheral edge portion of the protective layer PL is calculated based on image data obtained by the image pickup means 50, and a center position of the protective layer PL is calculated. The protective tape PT is subjected to positional adjustment to position the center of the protective layer PL at a predetermined reference position. Then, the positioned protective tape PT is conveyed to the tape application section F while being held by the tape holding body 30 as illustrated in FIG. 12, and the protective tape PT is placed on the dicing frame DF in the lower chamber 6B as illustrated in FIG. 13. In this case, the center position of the dicing frame DF placed on the frame base 61 is matched with the center position of the protective layer PL of the protective tape PT placed on the dicing frame DF.

Next, in the tape application section F, the protective tape PT is applied to the wafer W. First, when the protective tape PT is supplied above the wafer W as illustrated in FIG. 13, the upper chamber 6A is moved downward to be combined with the lower chamber 6B to form the vacuum chamber 6 as illustrated in FIG. 14. Then, the vacuum chamber 6 is decompressed through the vacuum adaptor 66 to bring the vacuum chamber 6 into a predetermined decompressed state. At this time, the application table 60 is raised to bring the wafer W into contact with the protective tape PT, and the pressing member 62 is moved downward to press the protective tape PT from above as illustrated in FIG. 15. In this case, when the peripheral portion of the protective layer PL of the protective tape PT is pressed by the protective layer outer periphery retainer 620 of the pressing member 62, the pressure-sensitive adhesive layer AL is applied to the outer peripheral edge portion of the wafer W. When the outer peripheral edge portion of the protective tape PT is pressed by the tape outer periphery retainer 621 of the pressing member 62, the protective tape PT is applied to the dicing frame DF through intermediation of the pressure-sensitive adhesive layer AL. With this, the circuit (irregularities) on the front surface of the wafer W is covered with the protective layer PL, and the wafer W is mounted on the dicing frame DF through intermediation of the protective tape PT. After the vacuum chamber 6 is brought into an atmospheric-pressure state, the upper chamber 6A is moved upward to release the lower chamber 6B as illustrated in FIG. 16, and the dicing frame DF having the wafer W mounted thereon is conveyed to the heating section G by the second conveyance arm 9B as illustrated in FIG. 17.

Next, in the heating section G, the dicing frame DF having the wafer W mounted thereon is heated. First, as illustrated in FIG. 22, the reverse arm 13 turned upside down receives the dicing frame DF from the second conveyance arm 9B. After that, as illustrated in FIG. 23, the dicing frame DF is vertically reversed by rotating the reverse arm 13, and the dicing frame DF is placed on the heating table 12 under a state in which the protective tape PT serves as a lower surface. Then, the protective tape PT is heated by the heater 120 contained in the heating table 12 to soften the protective layer PL, and the protective layer PL is brought into close contact with the irregularities in the circuit forming section of the wafer W. With this, application of the protective tape PT to the wafer W is completed, and mounting of the wafer W on the dicing frame DF is also completed. Then, as illustrated in FIG. 24 to FIG. 26, the second conveyance arm 9B is moved above the dicing frame DF, and the dicing frame DF is held by the second conveyance arm 9B. After that, the dicing frame DF is lifted up from the heating table 12, and the conveyance table 14 is moved below the second conveyance arm 9B so as to replace the heating table 12. Then, the dicing frame DF is placed on the conveyance table 14. As illustrated in FIG. 27, the dicing frame DF is conveyed to the frame accommodating section H by the conveyance table 14.

Finally, in the frame accommodating section H, as illustrated in FIG. 28, the dicing frame DF having the wafer W mounted thereon is accommodated in the accommodating cassette 15 from the conveyance table 14 via the conveyance rails 16 by the frame pusher 17.

As described above, with the application apparatus 1 and the application method having the above-mentioned configuration, in the tape peeling section A, the entire surface of the protective tape PT is held by the tape holding body 30, and the base material BM is peeled by the peeling mechanism 4 under a state in which the entire surface of the protective tape PT is held by the tape holding body 30. With this, the protective tape PT can be held with low tension so that residual stress does not remain. Further, even when the base material BM is peeled from the protective tape PT, a load applied to the protective tape PT can be extremely approximated to zero.

As a result, the protective tape PT can be applied to the wafer W under a state in which the residual stress is reduced. Therefore, when the wafer W is reduced in thickness by grinding a back surface of the wafer W, the wafer W can be prevented from being warped or broken due to the residual stress on the protective tape PT.

In addition, with the application apparatus 1 and the application method having the above-mentioned configuration, in the tape application section F, when the wafer W is mounted on the dicing frame DF after the protective tape PT is applied to the dicing frame DF, the protective tape PT is applied to the wafer W. With this, the protective tape PT is prevented from being pulled by an application roll at a time of application of the protective tape PT to the wafer W unlike the related-art method, and hence residual stress can also be prevented from being generated on the protective tape PT applied to the wafer W.

Further, with the application apparatus 1 and the application method having the above-mentioned configuration, the protective tape PT is not applied to the wafer W by being pressed against the wafer W with an application roller unlike the related-art method, and hence the irregularities of the wafer W can also be prevented from being broken. This effect is particularly significant with respect to a bump wafer having irregularities larger than those in the related-art circuit forming section, which have come to be often used for improving the function of a wafer in association with the recent increase in density of a semiconductor.

Thus, according to one embodiment of the present invention, it is possible to provide an application apparatus and an application method for applying a protective tape to a semiconductor wafer, in which residual stress generated on a protective tape can be reduced at a time of application of the protective tape to the wafer W. It is also possible to provide an application apparatus and an application method capable of satisfactorily applying a protective tape to a bump wafer.

The embodiment of the present invention is described above. However, the present invention is not limited thereto, and various modifications can be made without departing from the spirit of the present invention.

For example, in the above-mentioned embodiment, the dicing frame DF heated in the heating section G is conveyed to the frame accommodating section H and accommodated in the accommodating cassette 15. However, the following configuration may be employed. That is, the heated dicing frame DF is conveyed to a tape cutting section I illustrated in FIG. 1 by the conveyance table 14, and the protective tape PT applied to the dicing frame DF is cut along the outer shape of the wafer W through use of a cutter unit 18. After that, the wafer W having the protective tape PT separated from the dicing frame DF is conveyed by the second wafer conveyance mechanism 19 and accommodated in a wafer accommodating portion (not shown) or an open portion in the accommodating cassette 10. Now, this configuration is specifically described with reference to FIG. 29 to FIG. 35.

First, in FIG. 25, the heated dicing frame DF is taken out from the heating table 12 by the second conveyance arm 9B, and the reverse arm 13 turned upside down receives the dicing frame DF from the second conveyance arm 9B. After that, the dicing frame DF is vertically reversed by rotating the reverse arm 13, and the dicing frame DF is placed on the conveyance table 14 under a state in which the wafer W serves as a lower surface (see FIG. 29). Then, as illustrated in FIG. 30, the dicing frame DF is conveyed below the cutter unit 18 of the tape cutting section I by the conveyance table 14. In this embodiment, an upper surface of the conveyance table 14 is appropriately formed into a convex shape in conformity with the thickness of the wafer W.

The cutter unit 18 is configured to move in the up-and-down direction between a cutting position for cutting the protective tape PT and a separation position above the cutting position through use of a drive source (not shown).

Further, the cutter unit 18 includes a cutter 180, a support plate 181 configured to support the cutter 180, and a motor 182 configured to drive the cutter 180 to rotate.

In the tape cutting section I, as illustrated in FIG. 31, when the dicing frame DF is conveyed, the cutter unit 18 is moved downward, and the cutter 180 is rotated to cut the protective tape PT along the outer shape of the wafer W. Then, as illustrated in FIG. 32, the cutter unit 18 is moved upward to be retracted to the separation position, and the second wafer conveyance mechanism 19 is moved onto the conveyance table 14.

In this embodiment, the second wafer conveyance mechanism 19 is configured to reciprocate in the Y direction between the tape cutting section I and the wafer alignment section D through use of a drive source (not shown). Further, the second wafer conveyance mechanism 19 includes an adsorption hand 190 capable of holding the wafer W, for example, by adsorption and a cylinder 191 configured to move the adsorption hand 190 in the up-and-down direction.

When the protective tape PT applied to the dicing frame DF is cut along the contour of the wafer W, the adsorption hand 190 is moved downward to adsorb the wafer W having the protective tape PT separated from the dicing frame DF on the conveyance table 14. Then, as illustrated in FIG. 33, after the adsorption hand 190 is moved upward, the wafer W having the protective tape PT is conveyed to the wafer alignment section D by the adsorption hand 190 to be placed on the rotary table 80. Then, the wafer W having the protective tape PT placed on the rotary table 80 is conveyed to and accommodated in the wafer accommodating portion (not shown) or the open portion in the accommodating cassette 10 by the first wafer conveyance mechanism 7.

Meanwhile, the dicing frame DF having the wafer W separated therefrom is conveyed to the frame accommodating section H by the conveyance table 14 as illustrated in FIG. 34, and the dicing frame DF is accommodated in the accommodating cassette 15 from the conveyance table 14 via the conveyance rails 16 by the frame pusher 17 as illustrated in FIG. 35.

The application apparatus 1 having the above-mentioned configuration may be connected to a back surface grinding device or the like so that the wafer W mounted on the dicing frame DF or the wafer W having the protective tape PT applied thereto is directly supplied to the back surface grinding device or the like.

REFERENCE SIGNS LIST 1 application apparatus
2 tape conveyance mechanism
4 peeling mechanism
30 tape holding body
31 holding-body moving mechanism
40 peeling plate
41 peeling plate moving mechanism
61 frame base
301 adsorption member
310 first up-and-down moving mechanism
320 first reciprocation mechanism
330 second reciprocation mechanism
W wafer
BM base material
PT protective tape
PL protective layer
DF dicing frame

The invention claimed is:

1. An application apparatus for applying a protective tape to a semiconductor wafer, comprising:
   a tape conveyance mechanism configured to convey the protective tape temporarily applied to a base material to a peeling position;
   a tape holding body that holds the protective tape;
   a holding-body moving mechanism that moves the tape holding body;
   a peeling mechanism configured to peel the base material from the protective tape held by the tape holding body at the peeling position;
   an application table configured to support the semiconductor wafer;
   a raising and lowering mechanism configured to raise and lower the application table;
   a frame base arranged in a periphery of and above the application table, the frame base being configured to support a dicing frame on which the semiconductor wafer is mounted; and
   a control device configured to control operations of the holding-body moving mechanism and the raising and lowering mechanism,
   wherein the control device is configured to control an operation of the holding-body moving mechanism such that the tape holding body moves to the peeling position and holds the protective tape;
   wherein the control device is configured to control operation of the holding-body moving mechanism such that the tape holding body holding the protective tape moves onto the frame base and applies the protective tape to the dicing frame; and
   wherein the control device is configured to control an operation of the raising and lowering mechanism such that the application table rises to allow the semiconductor wafer to be applied to the protective tape applied to the dicing frame.

2. An application apparatus for applying a protective tape according to claim 1,
   wherein the base material has a band shape and has a plurality of protective tapes arranged on the base material at intervals along a conveyance direction of the base material, and
   wherein the peeling mechanism includes a peeling plate and a peeling plate moving mechanism configured to cause the peeling plate to reciprocate in the conveyance direction of the base material, the peeling mechanism being configured to peel the base material from the protective tape by moving the peeling plate in a direction opposite to the conveyance direction of the base material while folding back the base material with a distal end of the peeling plate.

3. An application apparatus for applying a protective tape according to claim 1, wherein the tape holding body includes an adsorption member that adsorbs an entire surface of the protective tape.

4. An application apparatus for applying a protective tape according to claim 1, wherein the holding-body moving mechanism includes an up-and-down moving mechanism configured to move the tape holding body in an up-and-down direction and a reciprocation mechanism configured to cause the tape holding body to reciprocate in an X direction along a horizontal surface and in a Y direction orthogonal to the X direction.

5. An application method of applying a protective tape to a semiconductor wafer, comprising:
- a tape conveyance step of conveying the protective tape temporarily applied to a base material to a peeling position by a tape conveyance mechanism;
- a holding-body moving step of moving a tape holding body that holds the protective tape to the peeling position by a holding-body moving mechanism;
- a peeling step of peeling the base material from the protective tape held by the tape holding body at the peeling position by a peeling mechanism;
- a step of applying the protective tape to a dicing frame by moving the tape holding body holding the protective tape onto a frame base supporting the dicing frame by the holding-body moving mechanism, the frame base being arranged in a periphery of and above the application table supporting the semiconductor wafer; and
- a step of mounting the semiconductor wafer on the dicing frame through the protective tape by applying the semiconductor wafer to the protective tape applied to the dicing frame by raising the application table by the raising and lowering mechanism.

\* \* \* \* \*